(12) United States Patent
Talwar et al.

(10) Patent No.: US 7,154,066 B2
(45) Date of Patent: Dec. 26, 2006

(54) LASER SCANNING APPARATUS AND METHODS FOR THERMAL PROCESSING

(75) Inventors: Somit Talwar, Los Gatos, CA (US); David A. Markle, Saratoga, CA (US)

(73) Assignee: Ultratech, Inc., San Jose, CA (US)

( * ) Notice: Subject to any disclaimer, the term of this patent is extended or adjusted under 35 U.S.C. 154(b) by 94 days.

(21) Appl. No.: 10/787,664

(22) Filed: Feb. 26, 2004

(65) Prior Publication Data

US 2004/0188396 A1    Sep. 30, 2004

Related U.S. Application Data

(63) Continuation-in-part of application No. 10/287,864, filed on Nov. 6, 2002, now Pat. No. 6,747,245.

(51) Int. Cl.
  *B23K 26/08* (2006.01)
(52) U.S. Cl. .............................. 219/121.8; 219/121.65
(58) Field of Classification Search ............. 219/121.8, 219/121.65, 121.74; 362/308
  See application file for complete search history.

(56) References Cited

U.S. PATENT DOCUMENTS

| | | | |
|---|---|---|---|
| 3,757,078 A * | 9/1973 | Conti et al. ............ | 219/121.75 |
| 4,288,678 A * | 9/1981 | La Rocca ............... | 219/121.65 |
| 4,356,375 A | 10/1982 | Josephy et al. ........ | 219/121 LH |
| 4,480,168 A * | 10/1984 | Cielo et al. ............. | 219/121.6 |
| 4,734,912 A | 3/1988 | Scerbak et al. ............... | 372/27 |
| 4,761,786 A | 8/1988 | Baer ............................ | 372/10 |
| 4,908,493 A | 3/1990 | Susemihl ............... | 219/121.67 |
| 5,057,664 A | 10/1991 | Johnson et al. ........ | 219/121.69 |
| 5,298,719 A * | 3/1994 | Shafir .................... | 219/121.73 |
| 6,208,673 B1 | 3/2001 | Miyake ....................... | 372/22 |
| 6,236,446 B1 * | 5/2001 | Izumi et al. ................ | 349/187 |
| 6,366,308 B1 | 4/2002 | Hawryluk et al. .......... | 347/256 |
| 6,531,681 B1 | 3/2003 | Markle et al. ........... | 219/121.8 |
| 6,747,245 B1 | 6/2004 | Talwar et al. ............ | 219/121.8 |

OTHER PUBLICATIONS

Naem, Boothroyd, Calder, *CW Laser Annealed Small-Geometry NMOS Transistors*, Mat. Res. Soc. Symp. Proc. vol. 23 (1984) pp. 229-234.

Goetzlich, Tsien, Ryssel, *Relaxation Behavior of Metastable AS and P Concentrations in SI After Pulsed and CW Laser Annealing*, Mat. Res. Soc. Symp. Proc. vol. 23 (1984) pp. 235-240.

* cited by examiner

*Primary Examiner*—Jonathan Johnson
(74) *Attorney, Agent, or Firm*—Allston L. Jones

(57) ABSTRACT

Apparatus and methods for thermally processing a substrate with scanned laser radiation are disclosed. The apparatus includes a continuous radiation source and an optical system that forms an image on a substrate. The image is scanned relative to the substrate surface so that each point in the process region receives a pulse of radiation sufficient to thermally process the region.

10 Claims, 26 Drawing Sheets

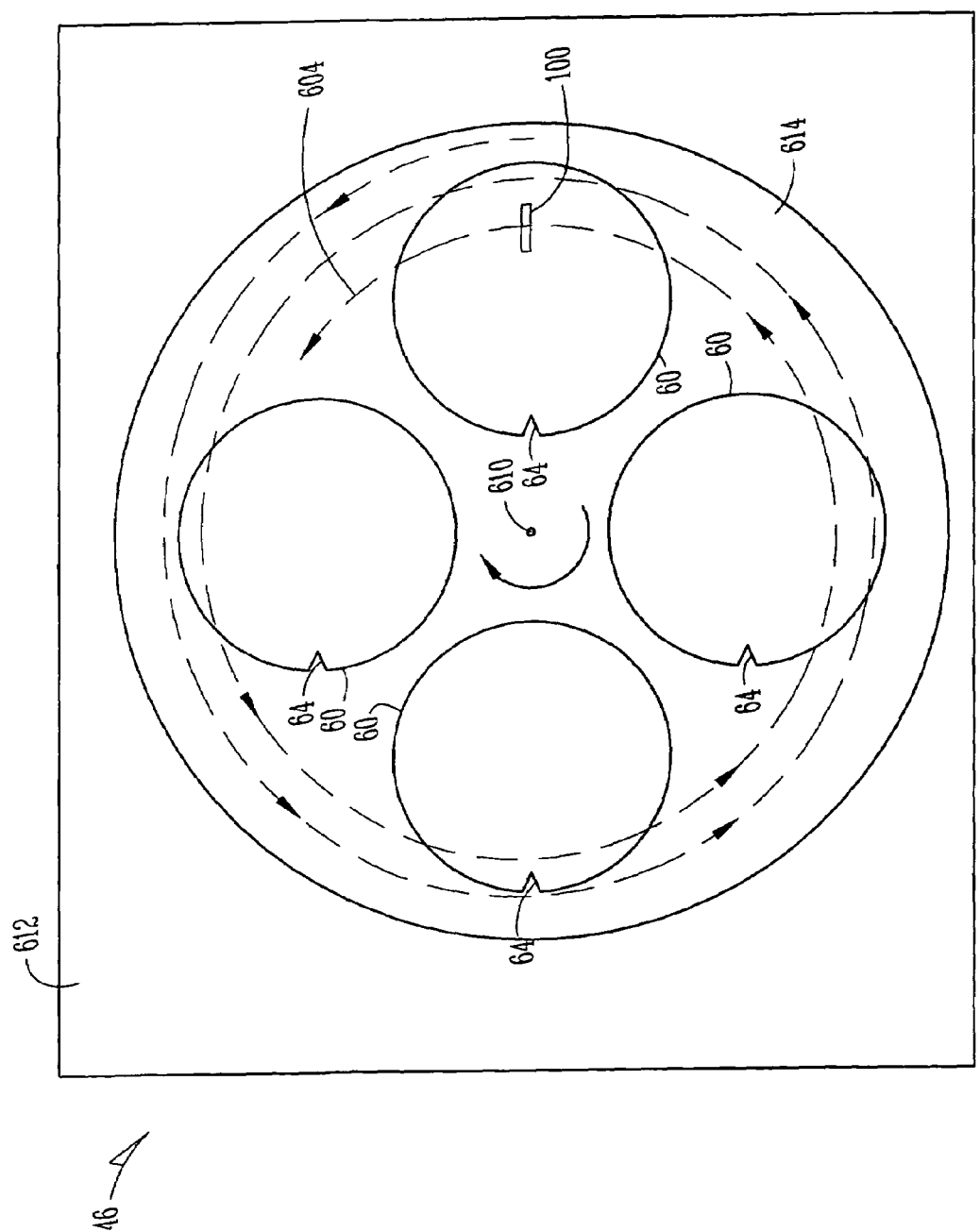

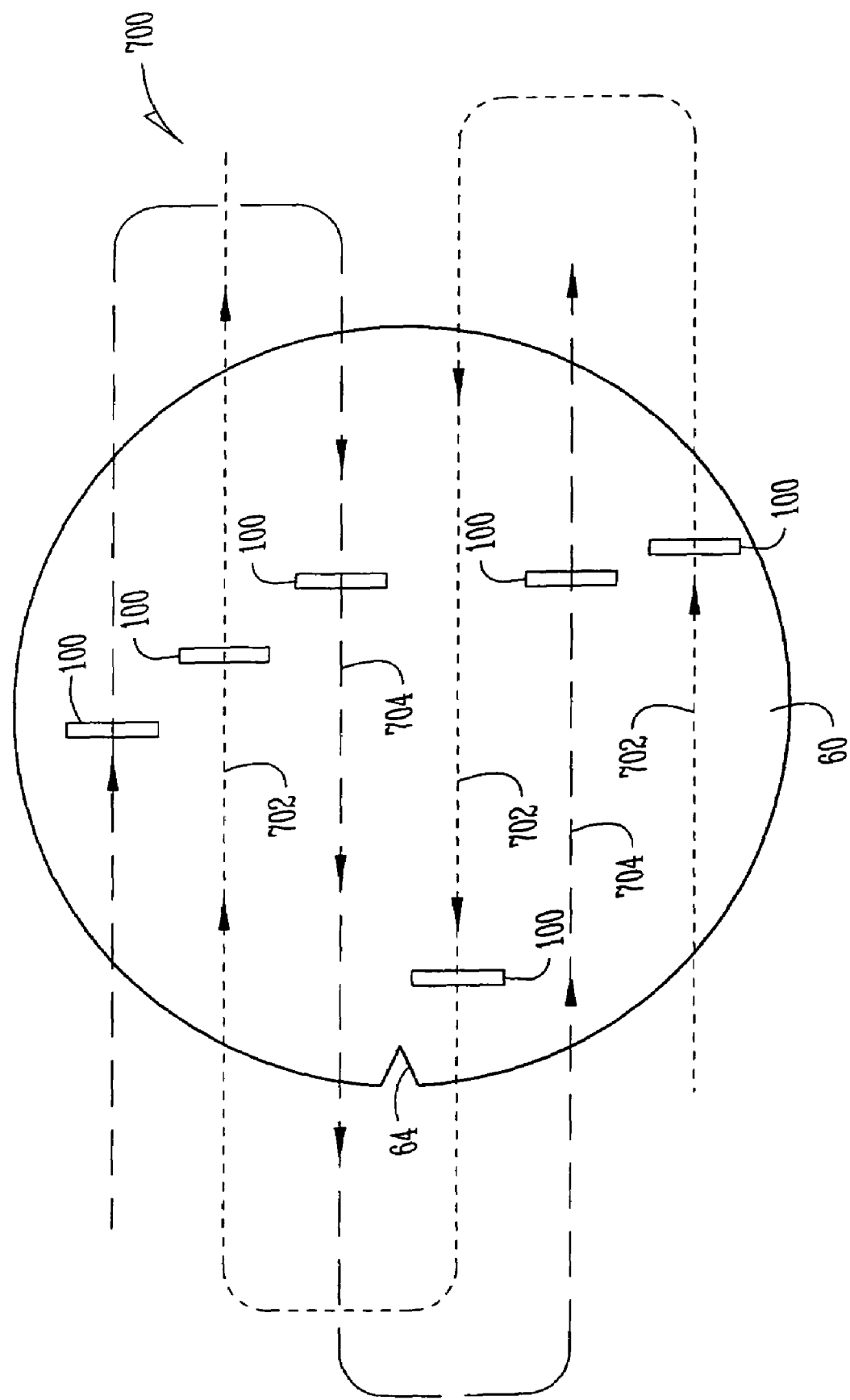

LASER SCANNING APPARATUS AND METHODS FOR THERMAL PROCESSING

CROSS REFERENCE

This application is a continuation-in-part application of the application having Ser. No. 10/287,864, filed Nov. 6, 2002 now U.S. Pat. No. 6,747,245.

BACKGROUND OF THE INVENTION

1. Field of the Invention

The present invention relates to apparatus and methods for thermally processing substrates, and in particular semiconductor substrates with integrated devices or circuits formed thereon.

2. Description of the Prior Art

The fabrication of integrated circuits (ICs) involves subjecting a semiconductor substrate to numerous processes, such as photoresist coating, photolithographic exposure, photoresist development, etching, polishing, and heating or "thermal processing." In certain applications, thermal processing is performed to activate dopants in doped regions (e.g., source and drain regions) of the substrate. Thermal processing includes various heating (and cooling) techniques, such as rapid thermal annealing (RTA) and laser thermal processing (LTP). Where a laser is used to perform thermal processing, the technique is sometimes called "laser processing" or "laser annealing."

Various techniques and systems for laser processing of semiconductor substrates have been known and used in the integrated circuit (IC) fabrication industry. Laser processing is preferably done in a single cycle that brings the temperature of the material being annealed up to the annealing temperature and then back down to the starting (e.g., ambient) temperature.

Substantial improvements in IC performance are possible if the thermal processing cycles required for activation, annealing, etc. can be kept to a millisecond or less. Thermal cycle times shorter than a microsecond are readily obtained using radiation from a pulsed laser uniformly spread over one or more circuits. An example system for performing laser thermal processing with a pulsed laser source is described in U.S. Pat. No. 6,366,308 B1, entitled "Laser Thermal Processing Apparatus and Method." However the shorter the radiation pulse, the shallower the region that can be heat-treated, and the more likely that the circuit elements themselves will cause substantial temperature variations. For example, a polysilicon conductor residing on a thick, field-oxide isolator is heated much more quickly than a shallow junction at the surface of the silicon wafer.

A more uniform temperature distribution can be obtained with a longer radiation pulse since the depth of heating is greater and there is more time available during the pulse interval for lateral heat conduction to equalize temperatures across the circuit. However, it is impractical to extend laser pulse lengths over periods longer than a microsecond and over circuit areas of 5 cm$^2$ or more because the energy per pulse becomes too high, and the laser and associated power supply needed to provide such high energy becomes too big and expensive.

An alternative approach to using pulsed radiation is to use continuous radiation. An example thermal processing apparatus that employs a continuous radiation source in the form of laser diodes is disclosed in U.S. patent application Ser. No. 09/536,869, entitled "Apparatus Having Line Source of Radiant Energy for Exposing a Substrate," which application was filed on Mar. 27, 2000 and is assigned to the same assignee as this application. Laser diode bar arrays can be obtained with output powers in the 100 W/cm range and can be imaged to produce line images about a micron wide. They are also very efficient at converting electricity into radiation. Further, because there are many diodes in a bar each operating at a slightly different wavelength, they can be imaged to form a uniform line image.

However, using diodes as a continuous radiation source is optimally suited only for certain applications. For example, when annealing source and drain regions having a depth less than say one micron or so, it is preferred that the radiation not be absorbed in the silicon beyond this depth. Unfortunately, the absorption depth for a typical laser diode operating at wavelength of 0.8 micron is about 20 microns for room temperature silicon. Thus, in thermal processing applications that seek to treat the uppermost regions of the substrate (e.g., shallower than say one microns), most of the diode-based radiation penetrates into a silicon wafer much farther than required or desired. This increases the total power required. While a thin absorptive coating could be used to reduce this problem, it adds complexity to what is already a rather involved manufacturing process.

SUMMARY OF THE INVENTION

An aspect of the invention is an apparatus for thermally processing a region of a substrate. The apparatus includes a continuous radiation source capable of providing a continuous radiation beam with a first intensity profile and a wavelength capable of heating the substrate region. An optical system is arranged downstream of the continuous radiation source and is adapted to receive the radiation beam and form a second radiation beam, which forms an image at the substrate. In an example embodiment, the image is a line image. The apparatus also includes a stage adapted to support the substrate. At least one of the optical system and the stage is adapted to scan the image with respect to the substrate in a scan direction to heat the region with a pulse of radiation to a temperature sufficient to process the region.

Another aspect of the invention is a method of thermally processing a region of a substrate. The method includes generating a continuous beam of radiation having a wavelength capable of heating the substrate region, and then scanning the radiation over the region in a scan direction so that each point in the region receives an amount of thermal energy capable of processing the substrate region.

BRIEF DESCRIPTION OF THE DRAWINGS

FIG. 12 is a plan view of four substrates residing on a stage capable of moving both rotationally and linearly to perform spiral scanning of the image over the substrates;

FIGS. 13A and 13B are plan views of a substrate illustrating an alternate raster scanning pattern wherein the scan paths are separated by a space to allow the substrate to cool before scanning an adjacent scan path;

Figure 1A:
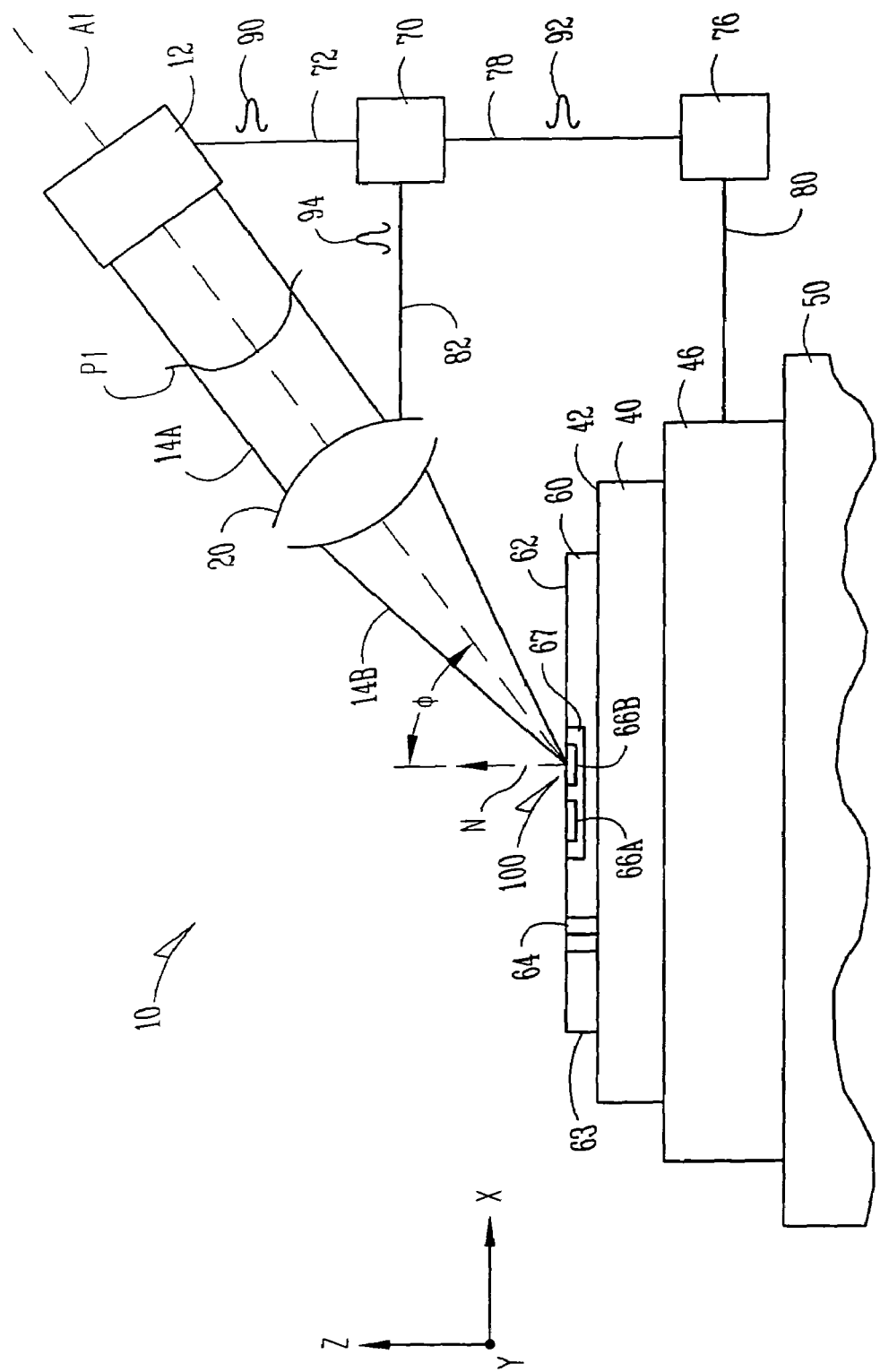
FIG. 1A is a schematic diagram of a generalized embodiment of the apparatus of the present invention.

The various elements depicted in the drawings are merely representational and are not drawn to scale. Certain proportions thereof may be exaggerated, while others may be minimized. The drawings are intended to illustrate various implementations of the invention, which can be understood and appropriately carried out by those of ordinary skill in the art.

DETAILED DESCRIPTION OF THE INVENTION

In the following detailed description of the embodiments of the invention, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

General Apparatus and Method

FIG. 1A is a schematic diagram of a generalized embodiment of the laser scanning apparatus of the present invention. Apparatus 10 of FIG. 1A includes, along an optical axis A1, a continuous radiation source 12 that emits a continuous radiation beam 14A having output power and an intensity profile P1 as measured at right angles to the optical axis. In an example embodiment, radiation beam 14A is collimated. Also in an example embodiment, radiation source 12 is a laser and radiation beam 14A is a laser beam. Further in the example embodiment, radiation source 12 is a carbon dioxide ($CO_2$) laser operating at a wavelength between about 9.4 microns and about 10.8 microns. A $CO_2$ laser is a very efficient converter of electricity into radiation and its output beam is typically very coherent so that profile P1 is Gaussian. Further, the infrared wavelengths generated by a $CO_2$ laser are suitable for processing (e.g., heating) silicon (e.g., a silicon substrate such as semiconductor wafer), as discussed below. Also in an example embodiment, radiation beam 14A is linearly polarized and can be manipulated so that the radiation incident on the substrate includes only a p-polarization P, or only a s-polarization state S, or both. Because radiation source 12 emits a continuous radiation beam 14A, it is referred to herein as a "continuous radiation source." Generally, radiation beam 14A includes radiation of a wavelength that is absorbed by the substrate and is therefore capable of heating the substrate.

Apparatus 10 also includes an optical system 20 downstream from radiation source 12 that modifies (e.g., focuses or shapes) radiation beam 14A to form a radiation beam 14B. Optical system 20 can consist of a single element (e.g., a lens element or a mirror) or can be made of multiple elements. In an example embodiment, optical system 20 may also include movable elements, such as a scanning mirror, as discussed in greater detail below.

Apparatus 10 further includes, downstream from optical system 20, a chuck 40 with an upper surface 42. Chuck 40 is supported by stage 46 that in turn is supported by a platen 50. In an example embodiment, chuck 40 is incorporated into stage 46. In another example embodiment, stage 46 is movable. Further in an example embodiment, substrate stage 46 is rotatable about one or more of the x, y and z axes. Chuck upper surface 42 is capable of supporting a substrate 60 having a surface 62 with a surface normal N, and an edge 63.

In an example embodiment, substrate 60 includes a reference feature 64 to facilitate alignment of the substrate in apparatus 10, as described below. In an example embodiment, reference feature 64 also serves to identify the crystal orientation of a monocrystalline substrate 60. In an example embodiment, substrate 60 is a monocrystalline silicon wafer, such as described in document #Semi M1-600, "Specifications for Polished Monocrystalline Silicon Wafers," available from SEMI (Semiconductor Equipment and Materials International), 3081 Zanker Road, San Jose 95134, which document is incorporated by reference herein.

Further in an example embodiment, substrate 60 includes source and drain regions 66A and 66B formed at or near surface 62 as part of a circuit (e.g., transistor) 67 formed in the substrate. In an example embodiment, source and drain regions 66A and 66B are shallow, having a depth into the substrate of one micron or less.

Axis A1 and substrate normal N form an angle $\Phi$, which is the incident angle $\phi$ that radiation beam 14B (and axis A1) makes with substrate surface normal N. In an example embodiment, radiation beam 14B has an incident angle $\phi>0$ to ensure that radiation reflected from substrate surface 62 does not return to radiation source 12. Generally, the incident angle can vary over the range $0°\leq\phi<90°$. However, certain applications benefit from operating the apparatus at select incident angles within this range, as described in greater detail below.

In an example embodiment, apparatus 10 further includes a controller 70 coupled to radiation source 12 via a communication line ("line") 72 and coupled to a stage controller 76 via a line 78. Stage controller 76 is operably coupled to stage 46 via a line 80 to control the movement of the stage. In an example embodiment, controller 70 is also coupled to optical system 20 via a line 82. Controller 70 controls the operation of radiation source 12, stage controller 76, and optical system 20 (e.g., the movement of elements therein) via respective signals 90, 92 and 94.

In one example embodiment, one or more of lines 72, 78, 80 and 82 are wires and corresponding one or more of signals 90, 92 and 94 are electrical signals, while in another example embodiment one or more of the aforementioned lines are an optical fiber and corresponding one or more of the aforementioned signals are optical signals.

In an example embodiment, controller 70 is a computer, such as a personal computer or workstation, available from any one of a number of well-known computer companies such as Dell Computer, Inc., of Austin Tex. Controller 70 preferably includes any of a number of commercially available micro-processors, such as a the Intel PENTIUM series, or AMD K6 or K7 processors, a suitable bus architecture to connect the processor to a memory device, such as a hard disk drive, and suitable input and output devices (e.g., a keyboard and a display, respectively).

With continuing reference to FIG. 1A, radiation beam 14B is directed by optical system 20 onto substrate surface 62 along axis A1. In an example embodiment, optical system 20 focuses radiation beam 14B to form an image 100 on substrate surface 62. The term "image" is used herein to generally denote the distribution of light formed on substrate surface 62 by radiation beam 14B. Thus, image 100 does not necessarily have an associated object in the classical sense. Further, image 100 is not necessarily formed by bringing light rays to a point focus. For example, image 100 can be an elliptical spot formed by an anamorphic optical system 20, as well as a circular spot formed a normally incident, focused beam formed from a circularly symmetric optical system. Also, the term "image" includes the light distribution formed on substrate surface 62 by intercepting beam 14B with substrate 60.

Figure 1B:
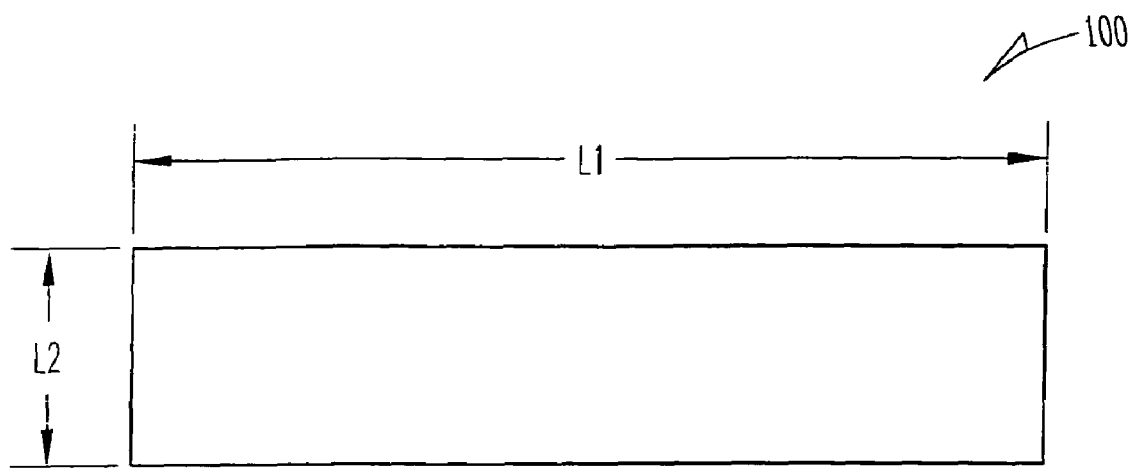
FIG. 1B illustrates an example embodiment of an idealized line image with a long dimension L1 and a short dimension L2 as formed on the substrate by the apparatus of FIG. 1A.

Image 100 may have any number of shapes, such as a square, rectangular, oval, etc. Also, image 100 can have a variety of different intensity distributions, including ones that correspond to a uniform line image distribution. FIG. 1B illustrates an example embodiment of image 100 as a line image. An idealized line image 100 has a long dimension (length) L1, a short dimension (width) L2, and uniform (i.e., flat-top) intensity. In practice, line image 100 is not entirely uniform because of diffraction effects.

Figure 1C:
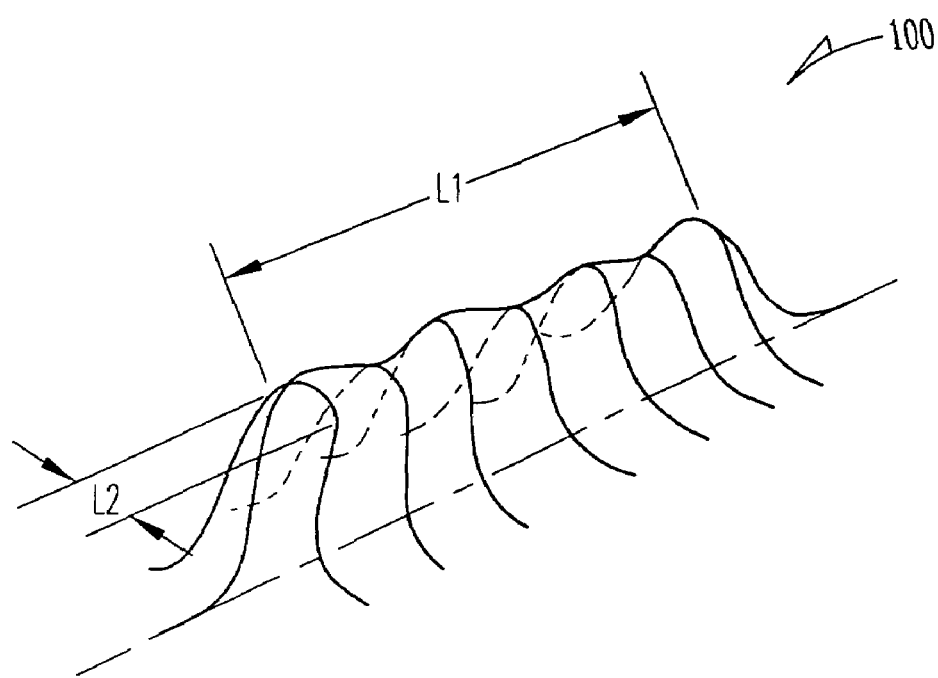
FIG. 1C is a two-dimensional plot representative of the intensity distribution associated with an actual line image.

FIG. 1C is a two-dimensional plot representative of the intensity distribution associated with an actual line image. For most applications, the integrated cross-section in the short dimension L2 need only be substantially uniform in the long dimension L1, with an integrated intensity distribution uniformity of about ±2% over the operationally useful part of the image.

With continuing reference to FIGS. 1B and 1C, in an example embodiment, length L1 ranges from about 1.25 cm to 4.4 cm, and width L2 is about 50 microns. In another example embodiment, length L1 is 1 cm or less. Further in an example embodiment, image 100 has an intensity ranging from 50 kW/cm$^2$ to 150 kW/cm$^2$. The intensity of image 100 is selected based on how much energy needs to be delivered to the substrate for the particular application, the image width L2, and how fast the image is scanned over substrate surface 62.

Figure 1D:
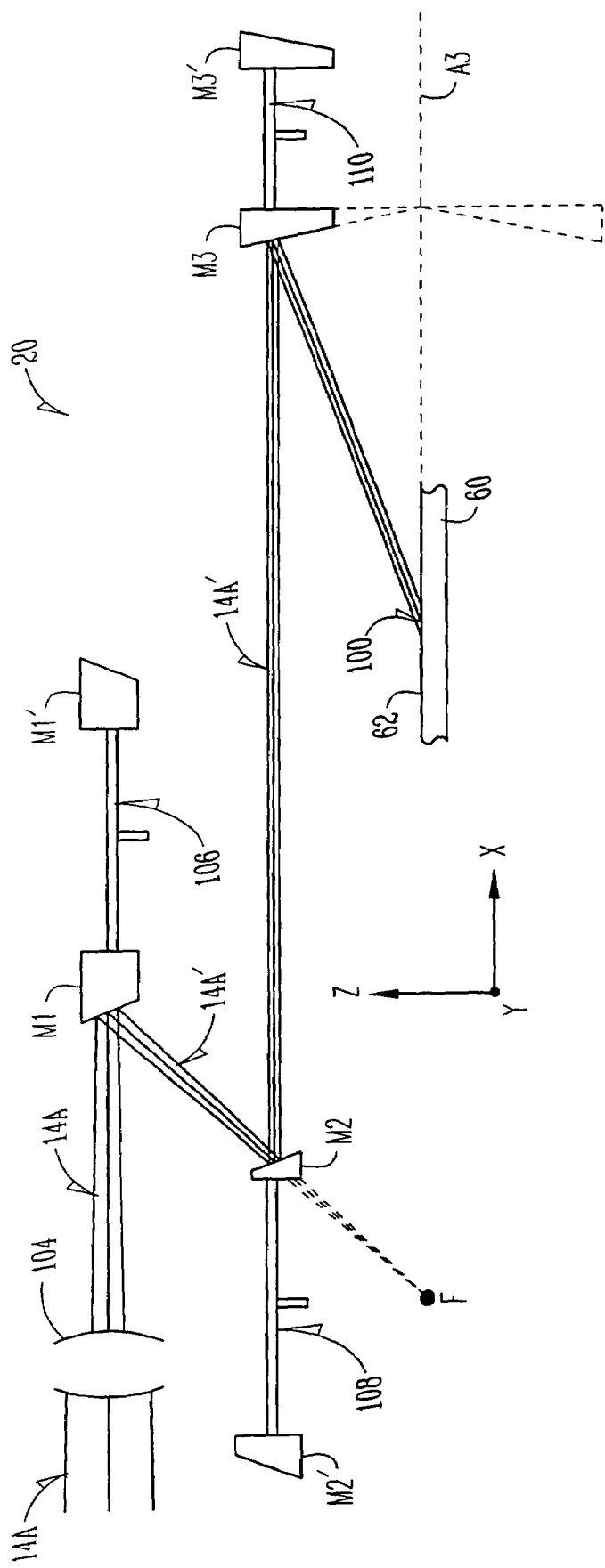
FIG. 1D is a schematic diagram of an example embodiment of an optical system for the apparatus of FIG. 1A that includes conic mirrors to form a line image at the substrate surface.

FIG. 1D is a schematic diagram of an optical system 20 that includes conic mirrors M1, M2 and M3 to form a line image at the substrate surface. Optical system 20 of FIG. 1D illustrates how a segment of a reflective cone can be used to focus a collimated beam into a line image 100. Optical system 20 comprises, in one example embodiment, parabolic cylindrical mirror segments M1 and M2 and a conic mirror segment M3. Conic mirror segment M3 has an axis A3 associated with the whole of the conic mirror (shown in phantom). Axis A3 is parallel to collimated beam 14A and lies along substrate surface 62.

Line image 100 is formed on substrate surface 62 along axis A3. The advantage of this arrangement for optical system 20 is that it produces a narrow, diffraction-limited image 100 with a minimal variation in incident angle $\phi$. The length L1 of the line image depends primarily on incident angle $\phi$ and the size of the collimated beam measured in the y-direction. Different incident angles φ can be achieved by switching different conic mirror segments (e.g., mirror M3') into the path of radiation beam 14A'. The length L1 of line image 100 can be modified by changing the collimated beam size using, for example, adjustable (e.g., zoom) collimating optics 104.

With continuing reference to FIG. 1D, in an example embodiment, the size of collimated beam 14A' can be modified using cylindrical parabolic mirrors M1 and M2. Collimated beam 14A' is first brought to a line focus at point F by the positive, cylindrical, parabolic mirror M1. Before reaching the focus at point F, the focused beam 14A' is intercepted by negative parabolic mirror M2, which collimates the focused beam. The two cylindrical parabolic mirrors M1 and M2 change the width of the collimated beam in y-direction only. Therefore, the parabolic mirrors M1 and M2 also change the length L1 of line image 100 at substrate surface 62, but not the width L2 of the line image in a direction normal to the plane of the Figure.

Also shown in FIG. 1D are alternate parabolic mirrors M1' and M2' and an alternate conical mirror M3', all of which can be brought into predetermined fixed positions in the optical path using, for example, indexing wheels 106, 108 and 110.

With reference again to FIG. 1A, in an example embodiment, substrate surface 62 is scanned under image 100 using one of a number of scanning patterns discussed in greater detail below. Scanning can be achieved in a number of ways, including by moving either substrate stage 46, or radiation beam 14B. Thus, "scanning" as the term is used herein includes movement of the image relative to the surface of the substrate, regardless of how accomplished.

By scanning a beam of continuous radiation over substrate surface 62, e.g., over one or more select regions thereof, such as regions 66A and 66B, or one or more circuits such as transistor 67, each irradiated point on the substrate receives a radiation pulse. In an example embodiment employing a 200 microsecond dwell time (i.e., the duration the image resides over a given point), the amount of energy received by each scanned point on the substrate during a single scan ranges from 5 J/cm$^2$ to 50 J/cm$^2$. Overlapping scans serve to further increase the total absorbed energy. Thus, apparatus 10 allows for a continuous radiation source, rather than a pulsed radiation source, to be used to provide a controlled pulse or burst of radiation to each point on a substrate with energy sufficient to process one or more regions, e.g., circuits or circuit elements formed therein or thereupon. Processing, as the term is used herein, includes among other things, selective melting, explosive recrystallization, and dopant activation.

Further, as the term is used herein, "processing" does not include laser ablation, laser cleaning of a substrate, or photolithographic exposure and subsequent chemical activation of photoresist. Rather, by way of example, image 100 is scanned over substrate 60 to provide sufficient thermal energy to raise the surface temperature of one or more regions therein to process the one or more regions, e.g., activate dopants in source and drain regions 66A and 66B or otherwise alter the crystal structure of the one or more regions. In an example embodiment of thermal processing, apparatus 10 is used to quickly heat and cool, and thereby activate, shallow source and drain regions, i.e., such as source and drain regions 66A and 66B of transistor 67 having a depth into the substrate from surface 62 of one micron or less.

Apparatus 10 has a number of different embodiments, as illustrated by the examples discussed below.

Embodiment with Beam Converter

In an example embodiment shown in FIG. 1A, profile P1 of radiation beam 14A is non-uniform. This situation may arise, for example, when radiation source 12 is a substantially coherent laser and the resultant distribution of energy in the collimated beam is Gaussian, which results in a similar energy distribution when the collimated beam is imaged on the substrate. For some applications, it may be desirable to render radiation beams 14A and 14B into a more uniform distribution and change their size so that image 100 has an intensity distribution and size suitable for performing thermal processing of the substrate for the given application.

Figure 2A:
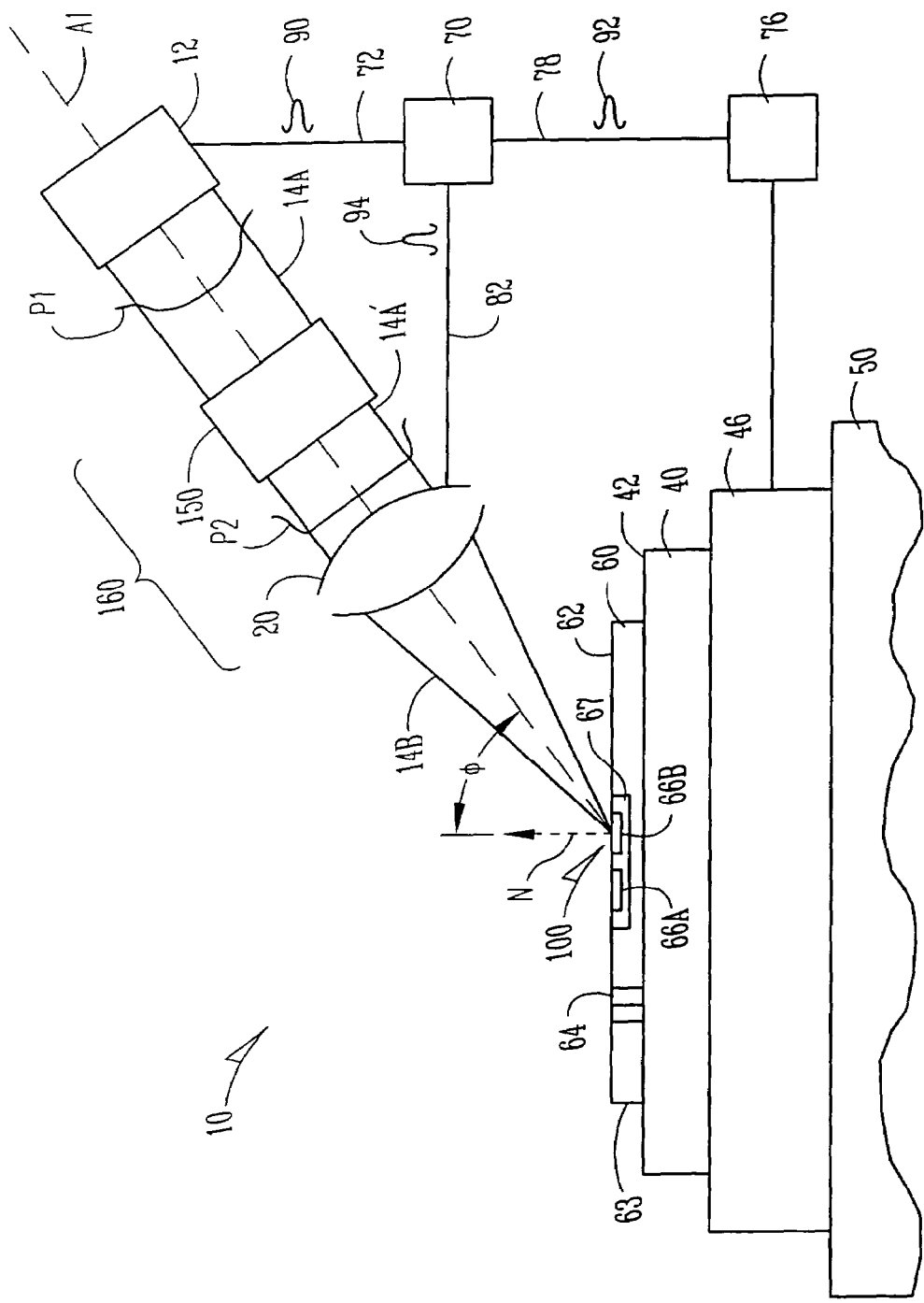
FIG. 2A is a schematic diagram illustrating an example embodiment of the laser scanning apparatus of FIG. 1A, further including a beam converter arranged between the radiation source and the optical system.

FIG. 2A is a schematic diagram illustrating an example embodiment of laser scanning apparatus 10 of FIG. 1A that further includes a beam converter 150 arranged along axis A1 between optical system 20 and continuous radiation source 12. Beam converter 150 converts radiation beam 14A with an intensity profile P1 to a modified radiation beam 14A' with an intensity profile P2. In an example embodiment, beam converter 150 and optical system 20 are combined to form a single converter/optical system 160. Though beam converter 150 is shown as arranged upstream of optical system 20, it could also be arranged downstream thereof.

Figure 2B:
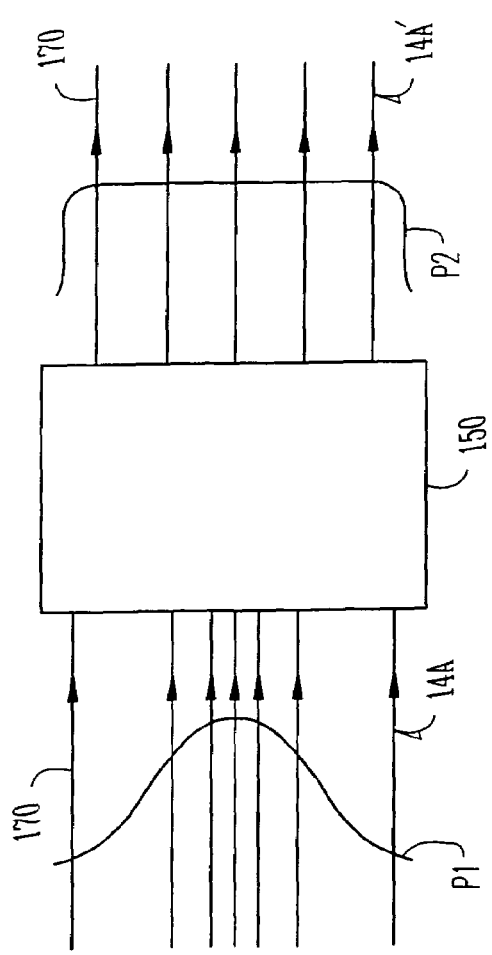
FIG. 2B is a schematic diagram illustrating how the beam converter of the apparatus of FIG. 2A modifies the profile of a radiation beam.

FIG. 2B is a schematic diagram that illustrates how beam converter 150 converts radiation beam 14A with intensity profile P1 to modified radiation beam 14A' with an intensity profile P2. Radiation beams 14A and 14A' are shown as made up of light rays 170, with the light ray spacing corresponding to the relative intensity distribution in the radiation beams. Beam converter 150 adjusts the relative spacing (i.e., density) of rays 170 to modify profile P1 of radiation beam 14A to form modified radiation beam 14A' with profile P2. In example embodiments, beam converter 150 is a dioptric, catoptric or catadioptric lens system.

Figure 2C:
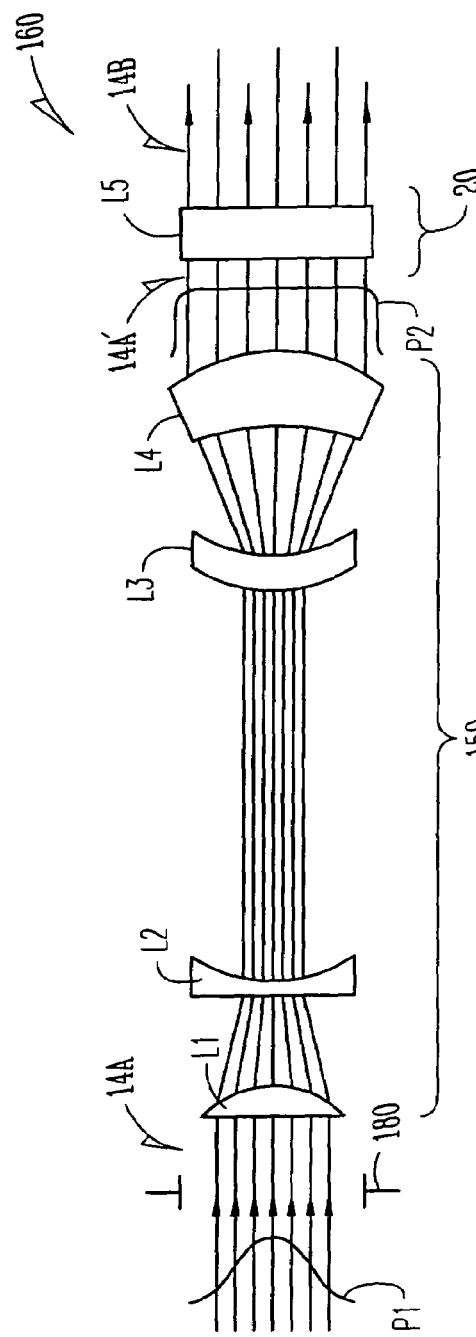
FIG. 2C is a cross-sectional view of an example embodiment of a converter/optical system that includes a Gaussian-to-flat-top converter.

FIG. 2C is a cross-sectional view of an example embodiment of a converter/optical system 160 having a converter 150 that converts radiation beam 14A with a Gaussian profile P1 into radiation beam 14A' with a flat-top (i.e., uniform) profile P2, and an optical system 20 that forms a focused radiation beam 14B and a line image 100. Converter/focusing system 160 of FIG. 2C includes cylindrical lenses L1 through L5. Here, "lenses" can mean individual lens elements or a group of lens elements, i.e., a lens group. The first two cylindrical lenses L1 and L2 act to shrink the diameter of radiation beam 14A, while cylindrical lenses L3 and L4 act to expand the radiation beam back to roughly its original size but with a modified radiation beam profile 14A' caused by spherical aberration in the lenses. A fifth cylindrical lens L5 serves as optical system 20 and is rotated 90° relative to the other lenses so that its power is out of the plane of the figure. Lens L5 forms radiation beam 14B that in turn forms line image 100 on substrate 60.

In an example embodiment, converter/focusing system 160 of FIG. 2C also includes a vignetting aperture 180 arranged upstream of lens L1. This removes the outermost rays of input beam 14A, which rays are overcorrected by the spherical aberration in the system, and which would otherwise result in intensity bumps on the edges of the otherwise flat intensity profile.

Figure 2D:
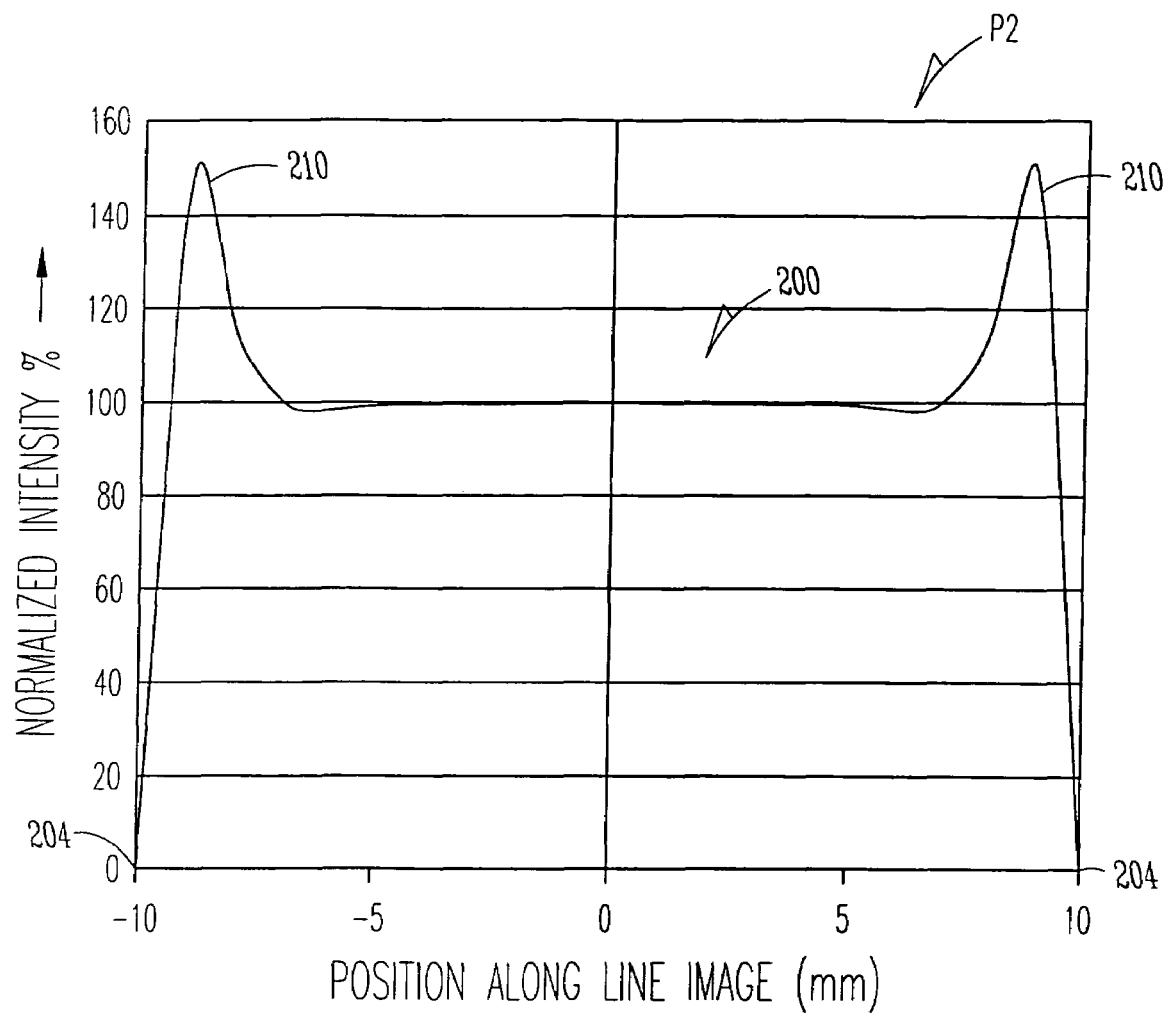
FIG. 2D is a plot of an example intensity profile of an unvignetted radiation beam, such as formed by the converter/optical system of FIG. 2C.
Figure 2E:
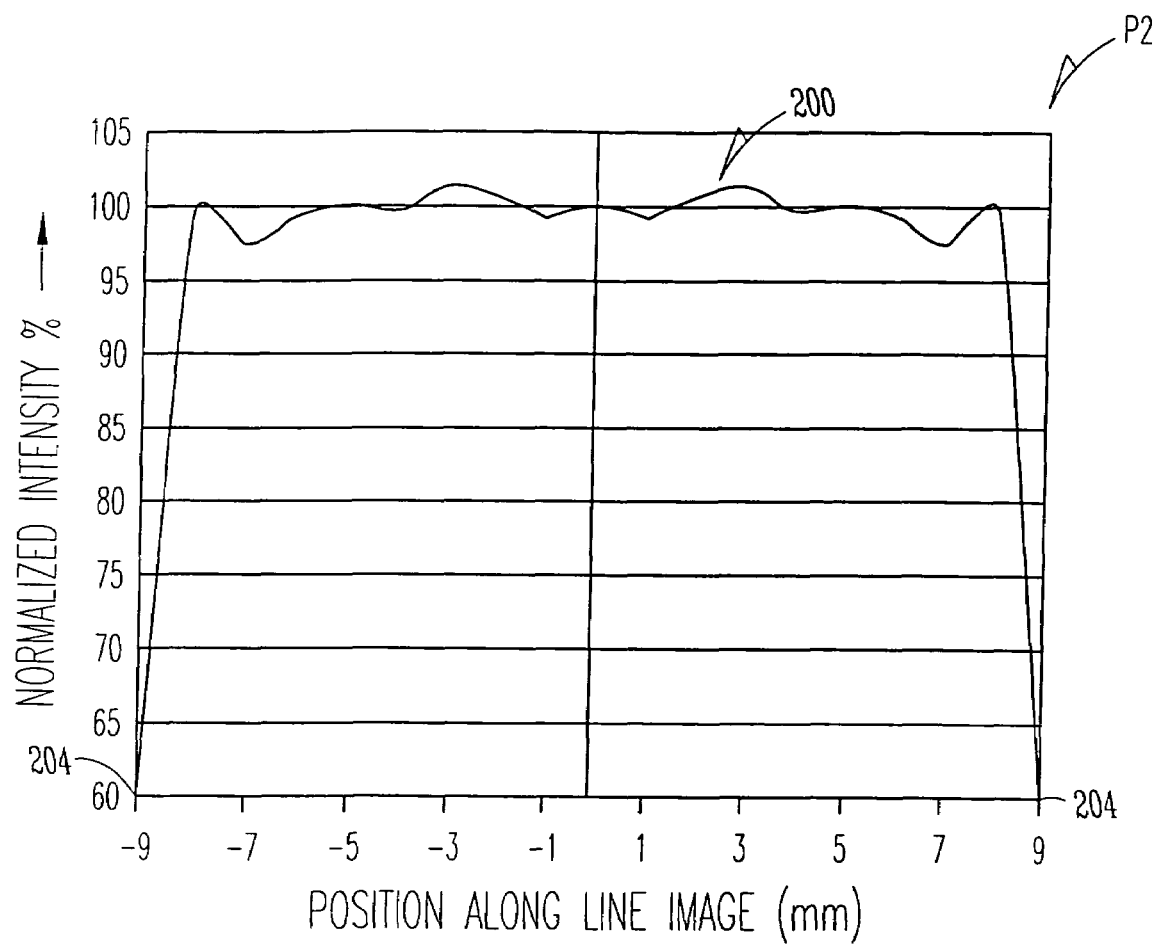
FIG. 2E is the plot as FIG. 2D with the edge rays vignetted by a vignetting aperture to reduce the intensity peaks at the ends of image.

FIG. 2D is a plot of an example intensity profile P2 of an unvignetted uniform radiation beam 14A' as might be formed by a typical beam converter 150. Typically, a flat-top radiation beam profile P2 has a flat portion 200 over most of its length, and near beam ends 204 includes intensity peaks 210. By removing the outer rays of the beam with vignetting aperture 180, it is also possible to obtain a more uniform radiation beam profile P2, as illustrated in FIG. 2E.

Although the rise in intensity at beam ends 204 can be avoided by vignetting the outermost rays of radiation beam 14A, some increase in intensity near the beam ends may be desirable to produce uniform heating. Heat is lost in the direction parallel to and normal to line image 100 (FIG. 1B) at beam ends 204. A greater intensity at beam ends 204 thus helps to compensate for the higher heat loss. This results in a more uniform temperature profile in the substrate as image 100 is scanned over substrate 60.

Further Example Embodiments

Figure 3:
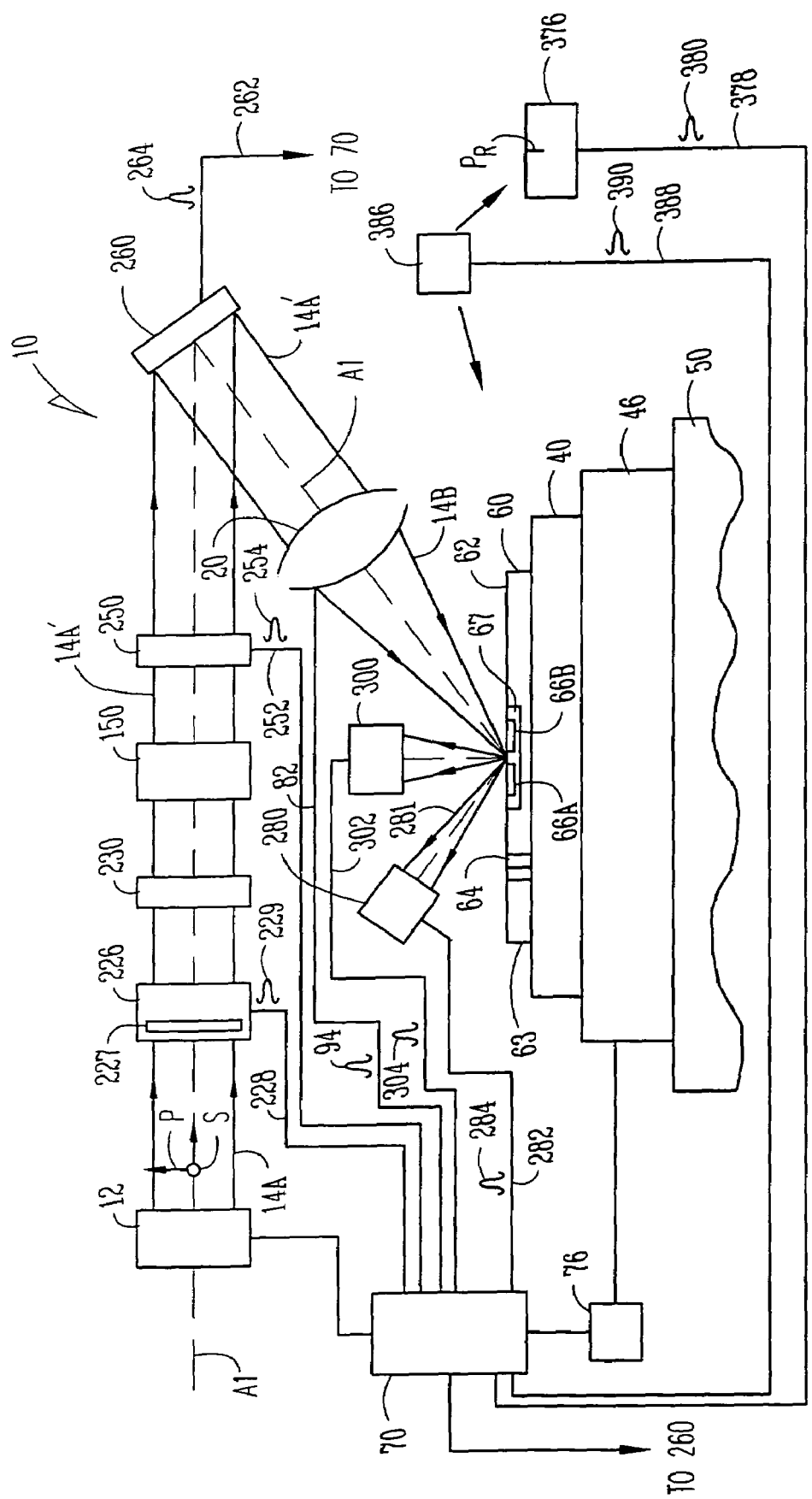
FIG. 3 is a schematic diagram similar to that of the apparatus of FIG. 1A with additional elements representing different example embodiments of the invention.

FIG. 3 is a schematic diagram of apparatus 10 similar to that of FIG. 1A that further includes a number of additional elements located across the top of the figure and above substrate 60. These additional elements either alone or in various combinations have been included to illustrate additional example embodiments of the present invention. It will be apparent to those skilled in the art how many of the additional elements introduced in FIG. 3 are necessary for the operation to be performed by each of the following example embodiments, and whether the elements discussed in a previous example embodiment is also needed in the embodiment then being discussed. For simplicity, FIG. 3 has been shown to include all of the elements needed for these additional example embodiments since some of these embodiments do build on a previously discussed embodiment. These additional example embodiments are discussed below.

Attenuator

With reference to FIG. 3, in one example embodiment, apparatus 10 includes an attenuator 226 arranged downstream of radiation source 12 to selectively attenuate either radiation beam 14A, beam 14A' or beam 14B, depending on the location of the attenuator. In an example embodiment, radiation beam 14A is polarized in a particular direction (e.g., p, s or a combination of both), and attenuator 226 includes a polarizer 227 capable of being rotated relative to the polarization direction of the radiation beam to attenuate the beam. In another example embodiment, attenuator 226 includes at least one of a removable attenuating filter, or a programmable attenuation wheel containing multiple attenuator elements.

In an example embodiment, attenuator 226 is coupled to controller 70 via a line 228 and is controlled by a signal 229 from the controller.

Quarter-wave Plate

In another example embodiment, radiation beam 14A is linearly polarized and apparatus 10 includes a quarter-wave plate 230 downstream of radiation source 12 to convert the linear polarization to circular polarization. Quarter-wave plate 230 works in conjunction with attenuator 226 in the example embodiment where the attenuator includes polarizer 227 to prevent radiation reflected or scattered from substrate surface 62 from returning to radiation source 12. In particular, on the return path, the reflected circularly polarized radiation is converted to linear polarized radiation, which is then blocked by polarizer 227. This configuration is particularly useful where the incident angle φ is at or near zero (i.e., at or near normal incidence).

Beam Energy Monitoring System

In another example embodiment, apparatus 10 includes a beam energy monitoring system 250 arranged along axis A1 downstream of radiation source 12 to monitor the energy in the respective beam. System 250 is coupled to controller 70 via a line 252 and provides to the controller a signal 254 representative of the measured beam energy.

Fold Mirror

In another example embodiment, apparatus 10 includes a fold mirror 260 to make the apparatus more compact or to form a particular apparatus geometry. In an example embodiment, fold mirror 260 is movable to adjust the direction of beam 14A'.

Further in an example embodiment, fold mirror 260 is coupled to controller 70 via a line 262 and is controlled by a signal 264 from the controller.

Reflected Radiation Monitor

With continuing reference to FIG. 3, in another example embodiment, apparatus 10 includes a reflected radiation monitor 280 arranged to receive radiation 281 reflected from substrate surface 62. Monitor 280 is coupled to controller 70 via a line 282 and provides to the controller a signal 284 representative of the amount of reflected radiation 281 it measures.

Figure 4:
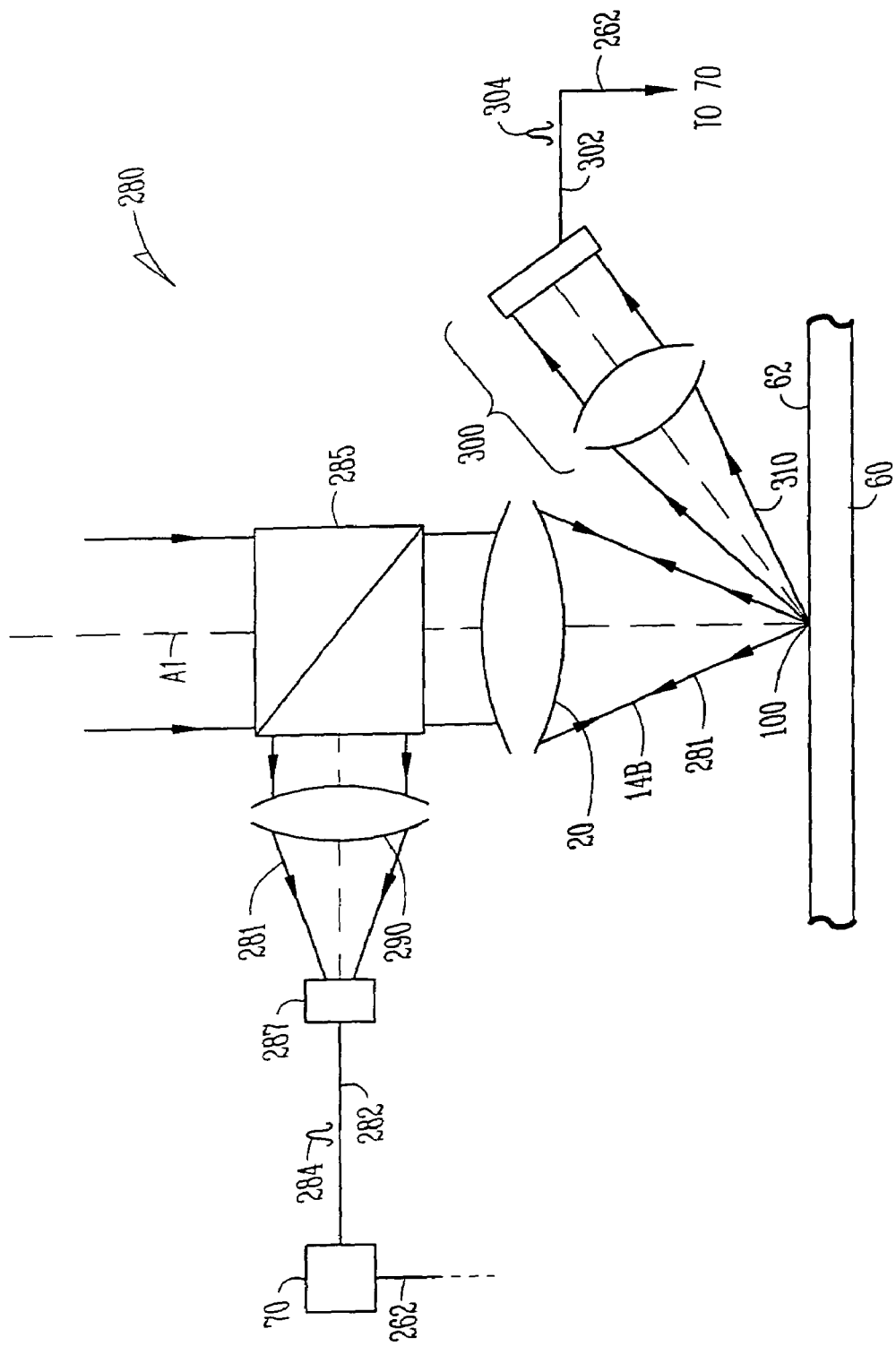
FIG. 4 illustrates an example embodiment of the reflected radiation monitor of the apparatus of FIG. 3 in which the incident angle Φ is equal to or near 0°.

FIG. 4 illustrates an example embodiment of reflected radiation monitor 280 for an example embodiment of apparatus 10 in which incident angle Φ (FIGS. 1 and 2A) is equal to or near 0°. Reflected radiation monitor 280 utilizes a beamsplitter 285 along axis A1 to direct a small portion of the reflected radiation 281 (FIG. 3) to a detector 287. Monitor 280 is coupled to controller 70 via line 282 and provides to the controller a signal 284 representative of the detected radiation. In an example embodiment, a focusing lens 290 is included to focus reflected radiation 281 onto detector 287.

Reflected radiation monitor 280 has several applications. In one mode of operation, image 100 is made as small as possible and the variation in the reflected radiation monitor signal 284 is measured. This information is then used to assess the variation in reflectivity across the substrate. This mode of operation requires that the response time of the detector (e.g., detector 287) be equal to less than the dwell time of the scanned beam. The variation in reflectivity is minimized by adjusting incident angle φ by adjusting the polarization direction of incident beam 14B, or both.

In a second mode of operation, beam energy monitoring signal 254 (FIG. 3) from beam energy monitoring system 250, and the radiation monitoring signal 284 are combined to yield an accurate measure of the amount of absorbed radiation. The energy in radiation beam 14B is then adjusted to maintain the absorbed radiation at a constant level. A variation of this mode of operation involves adjusting the scanning velocity in a manner corresponding to the absorbed radiation.

In a third mode of operation, the reflected radiation monitor signal 284 is compared to a threshold, and a signal above the threshold is used as a warning that an unexpected anomaly has occurred that requires further investigation. In an example embodiment, data relating to the variation in reflected radiation is archived (e.g., stored in memory in controller 70), along with the corresponding substrate identification code, to assist in determining the root cause of any anomalies found after substrate processing is completed.

Diagnostic System

In many thermal processes it is advantageous to know the maximum temperature or the temperature-time profile of the surface being treated. For example, in the case of junction annealing, it is desirable to very closely control the maximum temperature reached during LTP. Close control is achieved by using the measured temperature to control the output power of the continuous radiation source. Ideally, such a control system would have a response capability that is faster than, or about as fast as, the dwell time of the scanned image.

Accordingly, with reference again to FIG. 3, in another example embodiment, apparatus 10 includes a diagnostic system 300 in communication with substrate 60. Diagnostic system 300 is coupled to controller 70 via a line 302 and is adapted to perform certain diagnostic operations, such as measuring the temperature of substrate 62. Diagnostic system 300 provides to the controller a signal 304 representative of a diagnostic measurement, such as substrate temperature.

With reference again to FIG. 4, when incident angle Φ is equal to or near 0°, diagnostic system 300 is rotated out of the way of focusing optical system 20.

Figure 5:
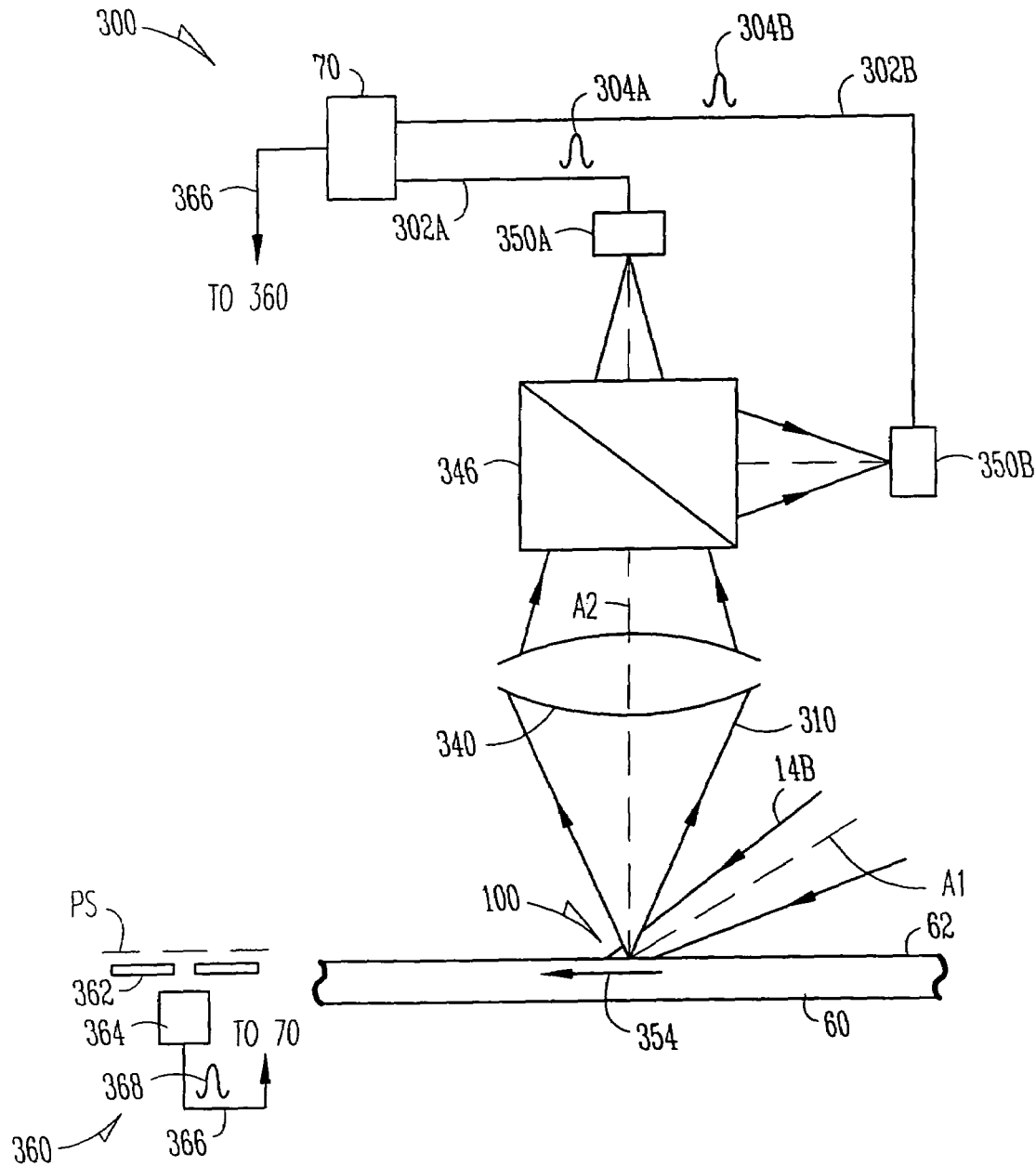
FIG. 5 is a close-up view of an example embodiment of the diagnostic system of the apparatus of FIG. 3 as used to measure the temperature of the substrate at or near the location of the image as it is scanned.

FIG. 5 is a close-up view of an example embodiment of diagnostic system 300 used to measure the temperature at or near the location of scanned image 100. System 300 of FIG. 5 includes along an axis A2 collection optics 340 to collect emitted radiation 310, and a beam splitter 346 for splitting collected radiation 310 and directing the radiation to two detectors 350A and 350B each connected to controller 70 via respective lines 302A and 302B. Detectors 350A and 350B detect different spectral bands of radiation 310.

A very simple configuration for diagnostic system 300 includes a single detector, such as a silicon detector 350A, aimed so that it observes the hottest spot at the trailing edge of the radiation beam (FIG. 3). In general, signal 304 from such a detector will vary because the different films (not shown) on the substrate that image 100 encounters have different reflectivities. For example, silicon, silicon oxide and a thin poly-silicon film over an oxide layer all have different reflectivities at normal incidence and consequently different thermal emissivities.

One way of coping with this problem is to use only the highest signal obtained over a given period of time to estimate the temperature. This approach improves accuracy at the cost of reducing the response time of the detector.

With continuing reference to FIG. 5, in an example embodiment, collection optics 340 is focused on the trailing edge of image 100 (moving in the direction indicated by arrow 354) to collect emitted radiation 310 from the hottest points on substrate 60. Thus, the hottest (i.e., highest) temperature on substrate 60 can be monitored and controlled directly. Control of the substrate temperature can be accomplished in a number of ways, including by varying the power of continuous radiation source 12, by adjusting attenuator 226 (FIG. 3), by varying the substrate scanning speed or the image scanning speed, or any combination thereof.

The temperature of substrate 60 can be gauged by monitoring emitted radiation 310 at a single wavelength, provided the entire surface 62 has the same emissivity. If surface 62 is patterned, then the temperature can be gauged by monitoring the ratio between two closely spaced wavelengths during the scanning operation, assuming the emissivity does not change rapidly with wavelength.

Figure 6:
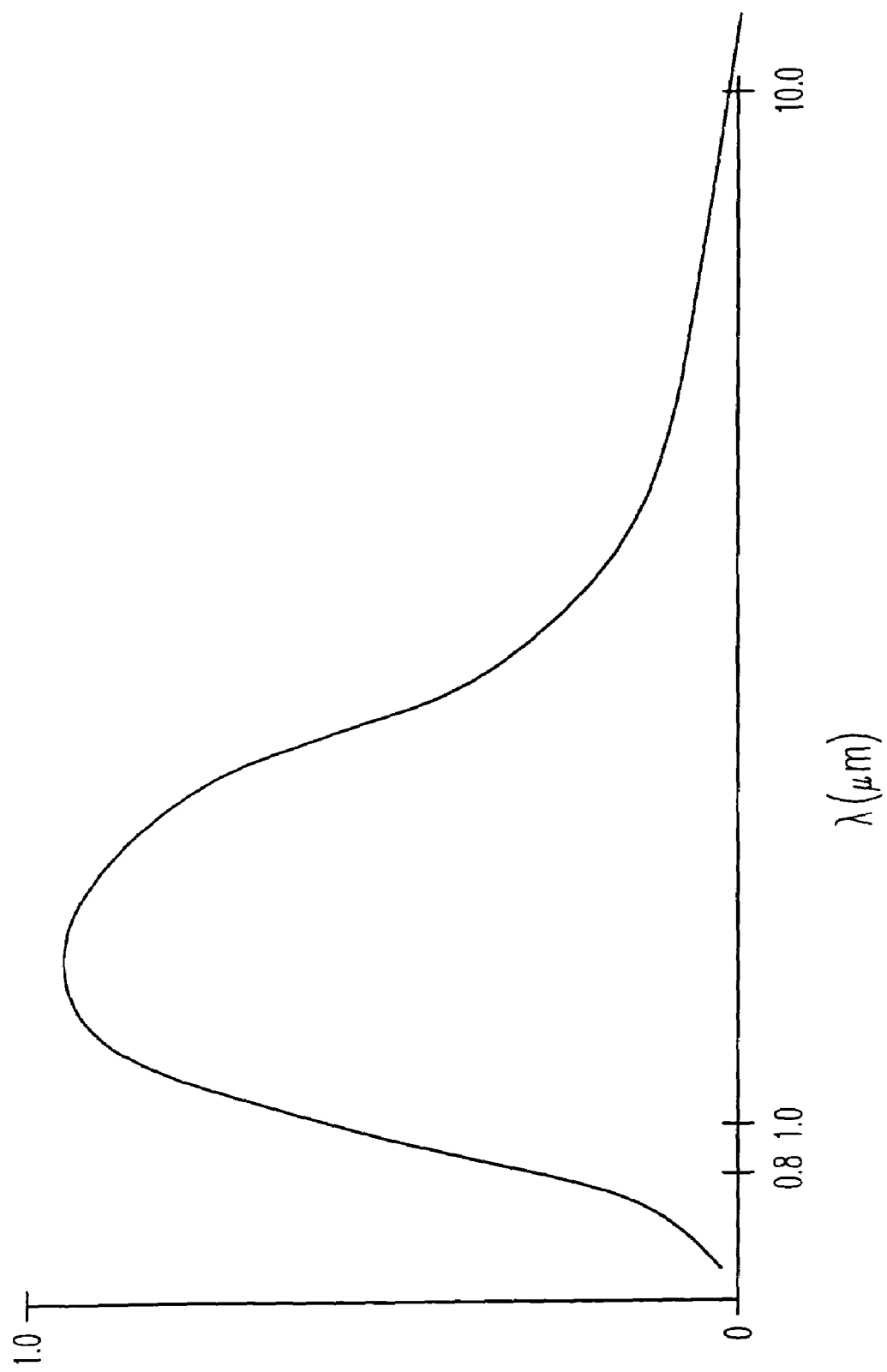
FIG. 6 is a profile (plot) of the relative intensity versus wavelength for a 1410° C. black body, which temperature is slightly above that used to activate dopants in the source and drain regions of a semiconductor transistor.

FIG. 6 is the black body temperature profile (plot) of the intensity versus wavelength for a temperature of 1410° C., which temperature would be the upper limit to be used in certain thermal processing applications to activate dopants in the source and drain regions of a semiconductor transistor, i.e., regions 66A and 66B of transistor 67 (FIG. 3). As can be seen from FIG. 6, a temperature approaching 1410° C. might be monitored at 0.8 microns and 1.0 microns using detectors 350A and 350B in the form of silicon detector arrays. An advantage of using detector arrays as compared to single detectors is that the former allows many temperature samples to be taken along and across image 100 so that any temperature non-uniformities or irregularities can be quickly spotted. In an example embodiment involving the activation of dopants in source and drain regions 66A and 66B, the temperature needs to be raised to 1400° C. with a point-to-point maximum temperature variation of less than 10° C.

For temperature control in the 1400° C. region, the two spectral regions might be from 500 nm to 800 nm and from 800 nm to 1100 nm. The ratio of the signals from the two detectors can be accurately related to temperature, assuming that the emissivity ratios for the two spectral regions does not vary appreciably for the various materials on the substrate surface. Using a ratio of the signals 304A and 304B from silicon detectors 350A and 350B for temperature control makes it relatively easy to achieve a control-loop bandwidth having a response time roughly equal to the dwell time.

An alternate approach is to employ detectors 350A and 350B in the form of detector arrays, where both arrays image the same region of the substrate but employ different spectral regions. This arrangement permits a temperature profile of the treated area to be obtained and both the maximum temperature and the temperature uniformity to be accurately assessed. This arrangement also permits uniformity adjustments to the intensity profile. Employing silicon detectors in such an arrangement allows for a control-loop bandwidth having a response time roughly equal to the dwell time.

Figure 7:
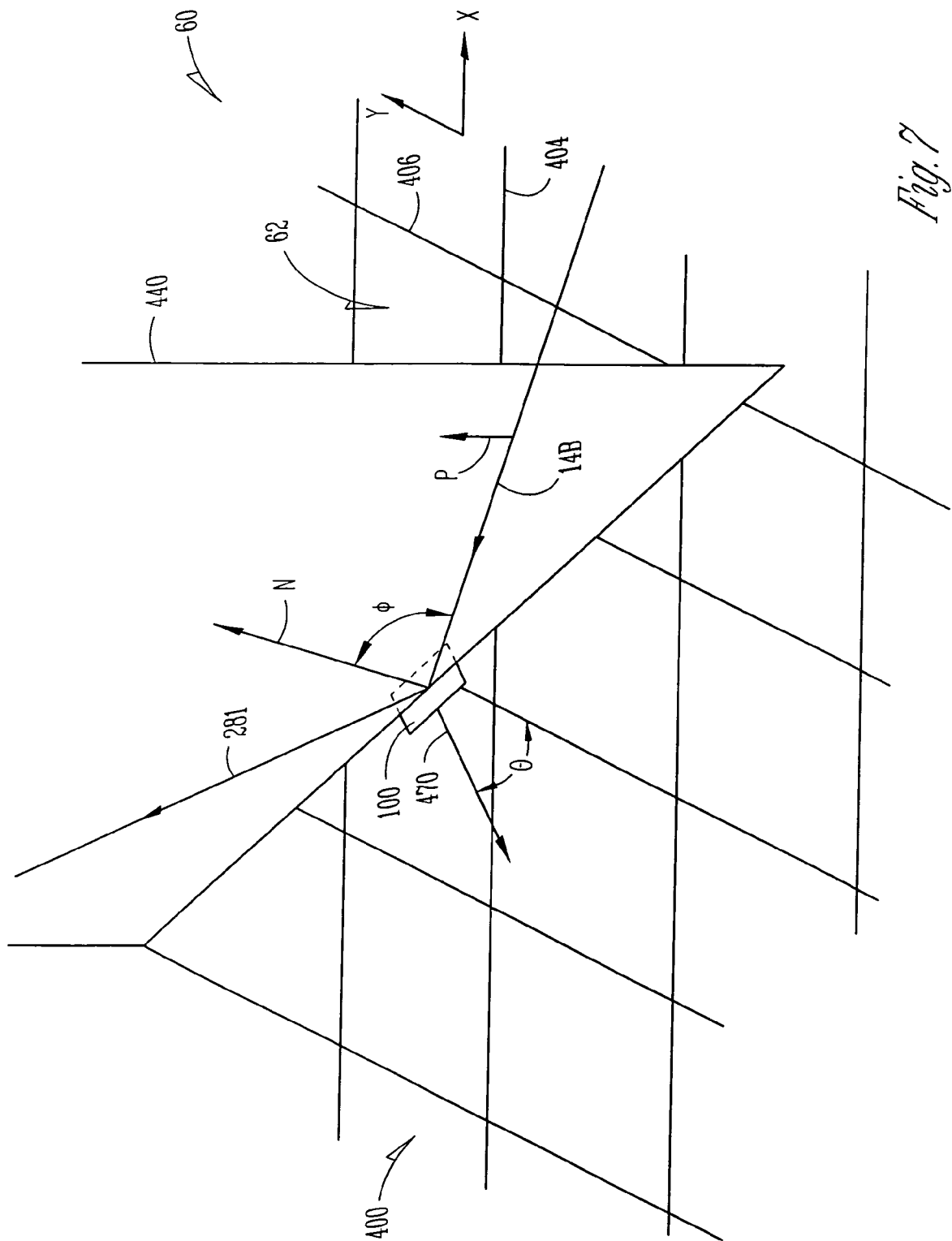
FIG. 7 is a close-up isometric view of a substrate having features aligned in a grid pattern illustrating 45 degree orientation of the plane containing the incident and reflected laser beams relative to the grid pattern features.

Another method to compensate for the varying emissivity of the films encountered on the substrate is to arrange diagnostic system 300 such that it views substrate surface 62 at an angle close to Brewster's angle for silicon using p-polarized radiation. In this case, Brewster's angle is calculated for a wavelength corresponding to the wavelength sensed by diagnostic system 300. Since the absorption coefficient is very nearly unity at Brewster's angle, so also is the emissivity. In an example embodiment, this method is combined with the methods of taking signal ratios at two adjacent wavelengths using two detector arrays. In this case, the plane containing the viewing axis of diagnostic system 300 would be at right angles to the plane 440 containing the radiation beam 14B and the reflected radiation 281, as illustrated in FIG. 7.

Scanned image 100 can produce uniform heating over a large portion of the substrate. However, diffraction, as well as a number of possible defects in the optical train, can interfere with the formation of the image and cause an unanticipated result, such as non-uniform heating. Thus, it is highly desirable to have a built-in image monitoring system that can directly measure the energy uniformity in the image.

An example embodiment of an image monitoring system 360 is illustrated in FIG. 5. In an example embodiment, image monitoring system 360 is arranged in the scanning path and in the plane PS defined by substrate surface 62. Image monitoring system 360 includes a pinhole 362 oriented in the scan path, and a detector 364 behind the pinhole. In operation, substrate stage 46 is positioned so that detector 364 samples image 100 representative of what a point on the substrate might see during a typical scan of the image. Image monitoring system 360 is connected to controller 70 via a line 366 and provides a signal 368 to the controller representative of the detected radiation.

Sampling portions of the image provides the data necessary for the image intensity profile (e.g., FIG. 1C) to be determined, which in turn allows for the heating uniformity of the substrate to be determined.

Substrate Pre-aligner

With reference again to FIG. 3, in certain instances, substrate 60 needs to be placed on chuck 40 in a predetermined orientation. For example, substrate 60 can be crystalline (e.g., a crystalline silicon wafer). The inventors have found that in thermal processing applications utilizing crystalline substrates it is often preferred that the crystal axes be aligned in a select direction relative to image 100 to optimize processing.

Accordingly, in an example embodiment, apparatus 10 includes a pre-aligner 376 coupled to controller 70 via a line 378. Pre-aligner 376 receives a substrate 60 and aligns it to a reference position $P_R$ by locating reference feature 64, such as a flat or a notch, and moving (e.g., rotating) the substrate until the reference feature aligns with the select direction to optimize processing. A signal 380 is sent to controller 70 when the substrate is aligned. The substrate is then delivered from the pre-aligner to chuck 40 via a substrate handler 386, which is in operative communication with the chuck and pre-aligner 376. Substrate handler 386 is coupled to controller 70 via a line 388 and is controlled via a signal 390. Substrate 60 is then placed on chuck 40 in a select orientation corresponding to the orientation of the substrate as pre-aligned on pre-aligner 376.

Measuring the Absorbed Radiation

By measuring the energy in one of radiation beams 14A, 14A' or 14B using beam energy monitoring system 250, and from measuring the energy in reflected radiation 281 using monitoring system 280, the radiation absorbed by substrate 60 can be determined. This in turn allows the radiation absorbed by substrate 60 to be maintained constant during scanning despite changes in the reflectance of substrate surface 62. In an example embodiment, maintaining a constant energy absorption per unit area is accomplished by adjusting one or more of the following: the output power of continuous radiation source 12; the scanning speed of image 100 over substrate surface 62; and the degree of attenuation of attenuator 226.

In an example embodiment, constant energy absorption per unit area is achieved by varying the polarization of radiation beam 14B, such as by rotating quarter wave plate 230. In another example embodiment, the energy absorbed per unit area is varied or maintained constant by any combination of the above mentioned techniques. The absorption in silicon of select infrared wavelengths is substantially increased by dopant impurities that improve the electrical conductivity of the silicon. Even if minimal absorption of the incident radiation is achieved at room temperature, any increase in temperature increases the absorption, thereby producing a runaway cycle that quickly results in all the incident energy being absorbed in a surface layer only a few microns deep.

Thus, the heating depth in a silicon wafer is determined primarily by diffusion of heat from the surface of the silicon rather than by the room-temperature absorption depth of the infrared wavelengths. Also, doping of the silicon with n-type or p-type impurities increases the room temperature absorption and further promotes the runaway cycle leading to strong absorption in the first few microns of material.

Incident Angle at or Near Brewster's Angle

In an example embodiment, incident angle $\phi$ is set to correspond to Brewster's angle. At Brewster's angle all the p-polarized radiation P (FIG. 3) is absorbed in substrate 60. Brewster's angle depends on the refractive index of the material on which the radiation is incident. For example, Brewster's angle is 73.69° for room temperature silicon and a wavelength $\lambda=10.6$ microns. Since about 30% of the incident radiation beam 14B is reflected at normal incidence ($\phi=0$), using p-polarization radiation at or near Brewster's angle can significantly reduce the power per unit area required to perform thermal processing. Using a relatively large incident angle $\phi$ such as Brewster's angle also broadens the width of image 100 in one direction by $\cos^{-1} \phi$, or by about 3.5 times that of the normal incidence image width. The effective depth of focus of image 100 is also reduced by a like factor.

Where substrate 60 has a surface 62 with a variety of different regions some of which have multiple layers, as is typically the case for semiconductor processing for forming ICs, the optimum angle for processing can be gauged by plotting the reflectivity versus incident angle $\Phi$ for the various regions. Generally it will be found that for p-polarized radiation that a minimum reflectivity occurs for every region near Brewster's angle for the substrate. Usually an angle, or a small range of angles, can be found that both minimizes and equalizes the reflectivity of each region.

In an example embodiment, incident angle $\Phi$ is confined within a range of angles surrounding Brewster's angle. For the example above where Brewster's angle is 73.69°, the incident angle $\phi$ may be constrained between 65° and 80°.

Optimizing the Radiation Beam Geometry

Thermally processing substrate 60 by scanning image 100 over surface 62, in an example embodiment, causes a very small volume of material at the substrate surface to be heated close to the melting point of the substrate. Accordingly, a substantial amount of stress and strain is created in the heated portion of the substrate. Under is some conditions, this stress results in the creation of undesirable slip planes that propagate to surface 62.

Also, in an example embodiment radiation beam 14A is polarized. In such a case, it is practical to choose the direction of polarization of the incident radiation beam 14B relative to substrate surface 62, as well as the direction of radiation beam 14B incident on surface 62 that results in the most efficient processing. Further, thermal processing of substrate 60 is often performed after the substrate has been through a number of other processes that alter the substrate properties, including the structure and topography.

FIG. 7 is a close-up isometric view of an example substrate 60 in the form of a semiconductor wafer having a pattern 400 formed thereon. In an example embodiment, pattern 400 contains lines or edges 404 and 406 conforming to a grid (i.e., a Manhattan geometry) with the lines/edges running in the X- and Y-directions. Lines/edges 404 and 406 correspond, for example, to the edges of poly-runners, gates and field oxide isolation regions, or IC chip boundaries. Generally speaking, in IC chip manufacturing the substrate is patterned mostly with features running at right angles to one another.

Thus, for example, by the time substrate (wafer) 60 has reached the point in the process of forming an IC chip where annealing or activation of the source and drain regions 66A and 66B is required, surface 62 is quite complex. For example, in a typical IC manufacturing process, a region of surface 62 may be bare silicon, while another region of the surface may have a relatively thick silicon oxide isolation trench, while yet other regions of the surface may have a thin polysilicon conductor traversing the thick oxide trench.

Accordingly, if care is not taken, line image 100 can be reflected or diffracted from some sections of substrate surface 62, and can be selectively absorbed in others, depending on the surface structure, including the dominant direction of the lines/edges 404 and 406. This is particularly true in the embodiment where radiation beam 14B is polarized. The result is non-uniform substrate heating, which is generally undesirable in thermal processing.

Thus, with continuing reference to FIG. 7, in an example embodiment of the invention, it is desirable to find an optimum radiation beam geometry, i.e., a polarization direction, an incident angle $\phi$, a scan direction, a scan speed, and an image angle $\theta$, that minimizes variations in the absorption of radiation beam 14B in substrate 60. It is further desirable to find the radiation beam geometry that minimizes the formation of slip planes in the substrate.

Point-to-point variations in radiation 281 reflected from, substrate 60 are caused by a number of factors, including film composition variations, the number and proportion of lines/edges 404 and 406, the orientation of the polarization direction, and the incident angle $\phi$.

With continuing reference to FIG. 7, a plane 440 is defined as that containing radiation beam 14B and reflected radiation 281. The variation in reflection due to the presence of lines/edges 404 and 406 can be minimized by irradiating the substrate with radiation beam 14B such that plane 440 intersects substrate surface 62 at 45° to lines/edges 404 and 406. The line image is formed so that its long direction is also either aligned in the same plane 440 or is at right angles to this plane. Thus, regardless of the incident angle $\phi$, the image angle $\theta$ between line image 100 and respective lines/edges 404 and 406 is 45°.

The variations in the amount of reflected radiation 281 due to the various structures on substrate surface 62 (e.g., lines/edges 404 and 406) can be further reduced by judiciously selecting incident angle $\phi$. For example, in the case of forming a transistor as part of an IC, when a substrate 60 is ready for annealing or activation of source and drain regions 66A and 66B, it will typically contain all of the following topographies: a) bare silicon, b) oxide isolators (e.g., about 0.5 microns thick) buried in the silicon, and c) a thin (e.g., 0.1 micron) polysilicon runners on top of buried oxide isolators.

Figure 8:
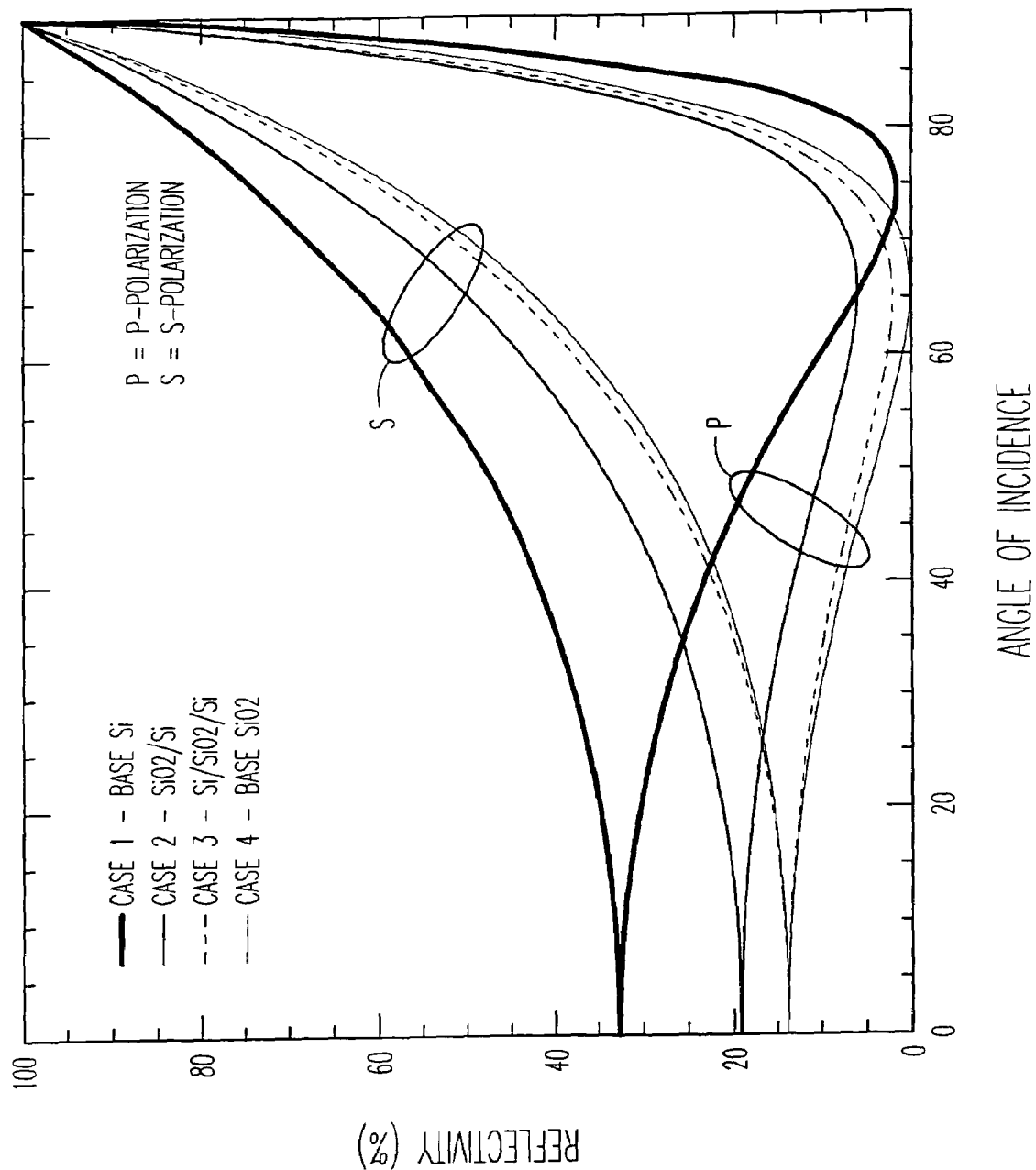
FIG. 8 plots the reflectivity versus incidence angle for both p and s polarization directions of a 10.6 micron laser radiation beam reflecting from the following surfaces: (a) bare silicon, (b) a 0.5 micron oxide isolator on top of the silicon, (c) a 0.1 micron, polysilicon runner on top of a 0.5 micron oxide isolator on silicon, and (d) an infinitely deep silicon oxide layer.

FIG. 8 is sets of plots of the room-temperature reflectivity for both p-polarization P and s-polarization S for a 10.6 micron wavelength laser radiation for each of the above-mentioned topographies atop an undoped silicon substrate, along with the reflectivity for a infinitely deep silicon dioxide layer. It is readily apparent from FIG. 8 that the reflectivity varies greatly depending on the polarization and the incident angle $\phi$.

For the p-polarization P (i.e., polarization in plane 440) with incident angles $\phi$ between about 65° and about 80°, the reflectivity for all four cases is a minimum, and the variation from case to case is also a minimum. Thus, the range of incident angles $\phi$ from about 65° to about 80° is particularly well suited for apparatus 10 for thermally processing a semiconductor substrate (e.g., activating doped regions formed in a silicon substrate), since it minimizes both the total power required and the point-to-point variation in absorbed radiation.

The presence of dopants or higher temperatures renders the silicon more like a metal and serves to shift the minimum corresponding to Brewster's angle to higher angles and higher reflectivities. Thus, for doped substrates and/or for higher temperatures, the optimum angle will be higher than those corresponding the Brewster's angle at room temperature for undoped material.

Figure 9:
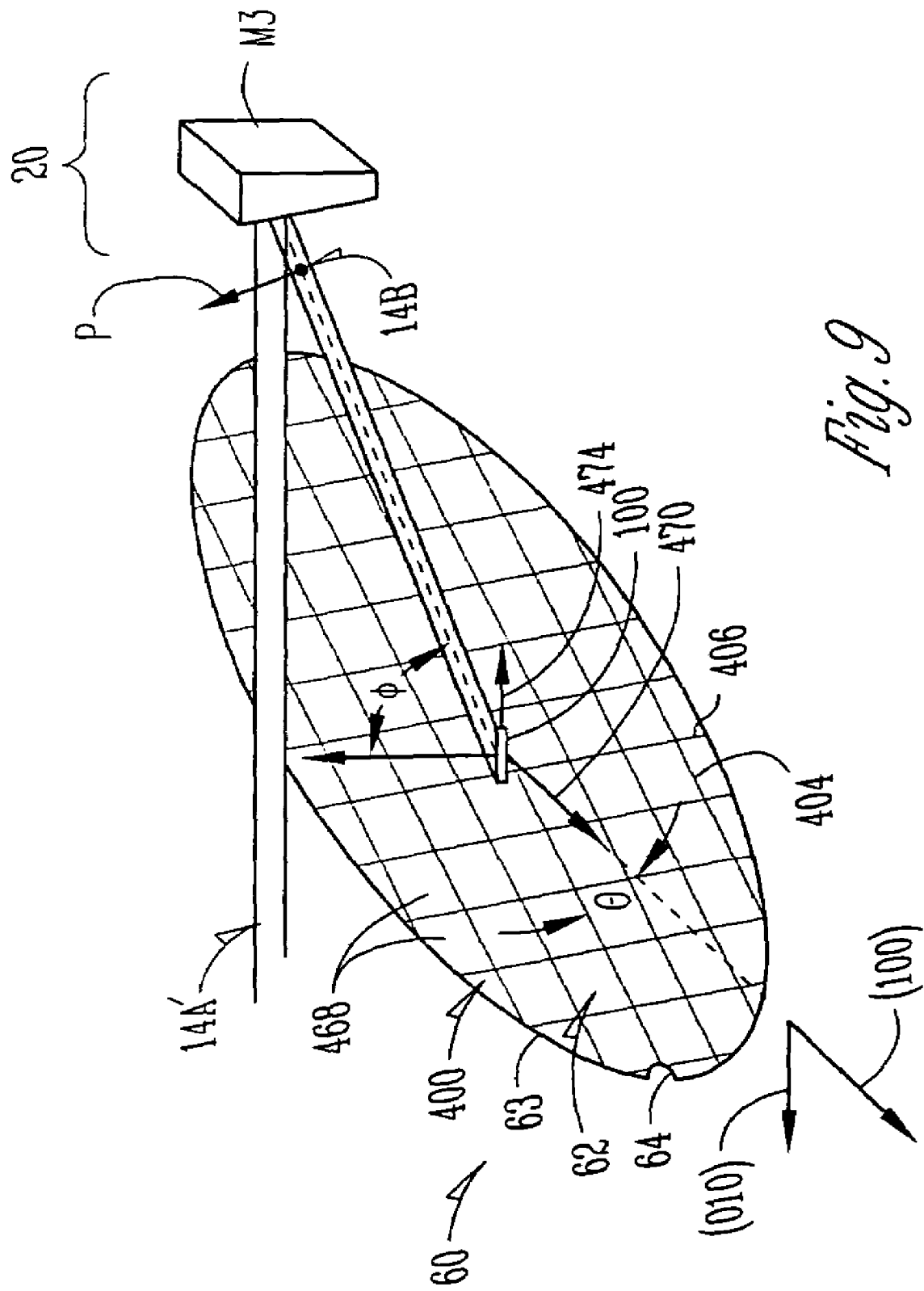
FIG. 9 is a top-down isometric view of an embodiment of the apparatus of the present invention as used to process a substrate in the form of a semiconductor wafer having a grid pattern formed thereon, illustrating operation of the apparatus in an optimum radiation beam geometry.

FIG. 9 is a top-down isometric view of apparatus 10 used to process a substrate 60 in the form of a semiconductor wafer, illustrating operation of the apparatus in an optimum radiation beam geometry. Wafer 60 includes grid pattern 400 formed thereon, with each square 468 in the grid representing, for example, an IC chip (e.g., such as circuit 67 of FIG. 1A). Line image 100 is scanned relative to substrate (wafer) surface 62 in a direction 470 that results in an image angle $\theta$ of 45°.

Accounting for Crystal Orientation

As mentioned above, crystalline substrates, such as monocrystalline silicon wafers, have a crystal planes whose orientation is often indicated by reference feature 64 (e.g., a notch as shown in FIG. 9, or a flat) formed in the substrate at edge 63 corresponding to the direction of one of the major crystal planes. The scanning of line image 100 generates large thermal gradients and stress concentrations in a direction 474 normal to scan direction 470 (FIG. 9), which can have an adverse effect on the structural integrity of a crystalline substrate.

With continuing reference to FIG. 9, the usual case is for a silicon substrate 60 having a (100) crystal orientation and lines/edges 404 and 406 aligned at 45° to the two principle crystal axes (100) and (010) on the surface on the wafer. A preferred scan direction is along one of the principle crystal axes to minimize the formation of slip planes in the crystal. Thus the preferred scan direction for minimizing slip generation in the crystal also coincides with the preferred direction with respect to lines/edges 404 and 406 in the usual case for a silicon substrate. If a constant orientation is to be maintained between line image 100, lines/edges 404 and 406, and the crystal axes (100) and (010), then the scanning of the line image with respect to the substrate (wafer) 60 must be performed in a linear (e.g., back and forth) fashion rather than in a circular or arcuate fashion. Also, since a specific scan direction is desired with respect to the crystal orientation, in an example embodiment the substrate is pre-aligned on chuck 40 using, for example, substrate pre-aligner 376 (FIG. 3).

By carefully choosing the orientation between the substrate crystal axes (100) and (010) and scan direction 470, it is possible to minimize the likelihood of producing slip planes in the substrate crystalline lattice due to thermally induced stress. The optimal scan direction wherein the crystal lattice has maximum resistance to slip induced by a steep thermal gradient is believed to vary depending on the nature of the crystal substrate. However, the optimal scan direction can be found experimentally by scanning image 100 in a spiral pattern over a single crystal substrate and inspecting the wafer to determine which directions withstand the highest temperature gradients before exhibiting slip.

In a substrate 60 in the form of a (100) crystal silicon wafer, the optimal scan direction is aligned to the (100) substrate crystal lattice directions or at 45° to the pattern grid directions indicated by lines/edges 404 and 406. This has been experimentally verified by the inventors by scanning a radially-oriented line image 100 in a spiral pattern that gradually increases the maximum temperature as a function of distance from the center of the substrate. The optimal scan direction was determined by comparing the directions exhibiting the greatest immunity to slipping with the directions of the crystal axes.

Image Scanning

Boustrophedonic Scanning

Figure 10:
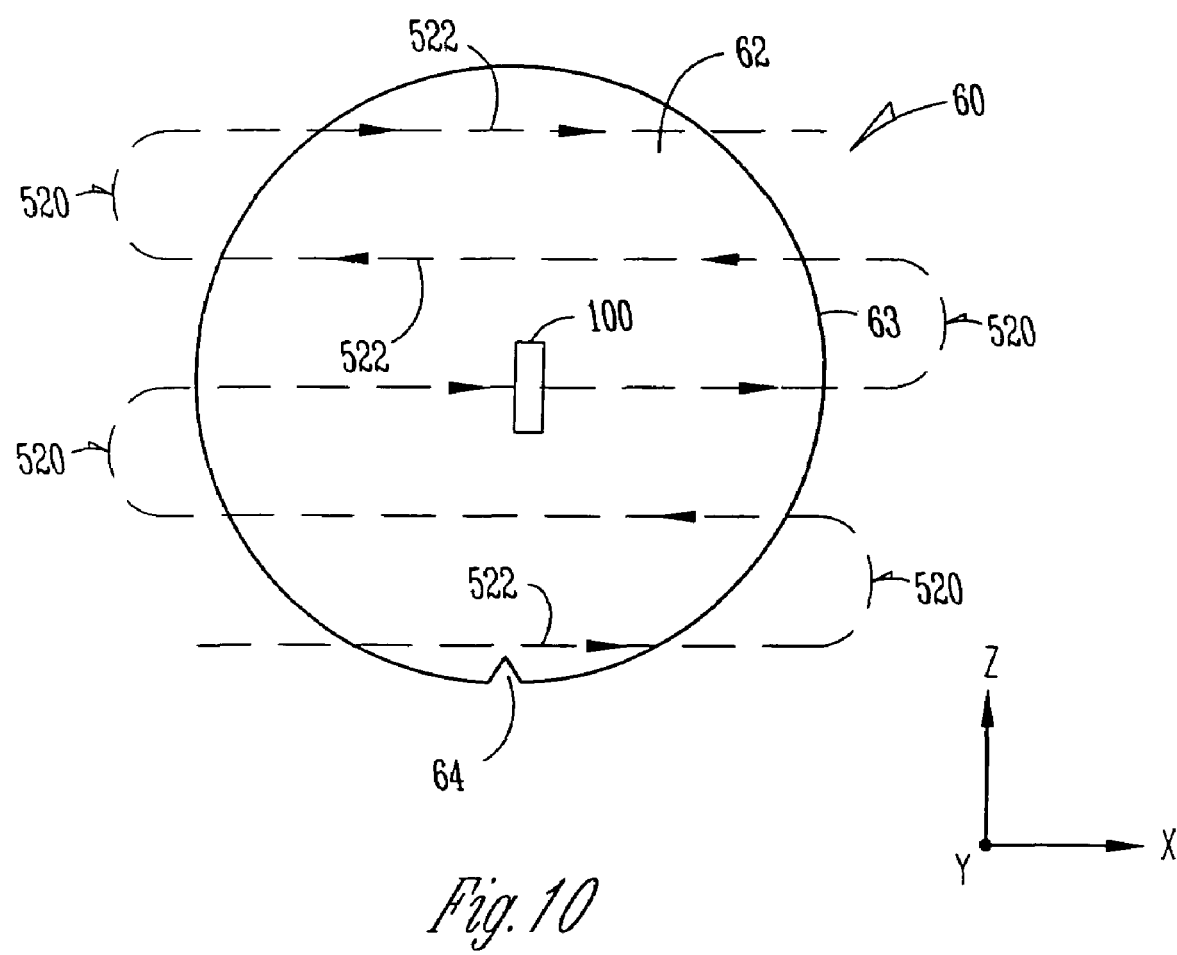
FIG. 10 is a plan view of a substrate illustrating a boustrophedonic scanning pattern of the image over the substrate surface.

FIG. 10 is a plan view of a substrate illustrating a boustrophedonic (i.e., alternating back and forth or "X-Y") scanning pattern 520 of image 100 over substrate surface 62 to generate a short thermal pulse at each point on the substrate traversed by the image. Scanning pattern 520 includes linear scanning segments 522. Boustrophedonic scanning pattern 520 can be carried out with a conventional bidirectional, X-Y stage 46. However, such stages typically have considerable mass and limited acceleration capability. If a very short dwell time (i.e., the duration the scanned image resides over a given point on the substrate) is desired, then a conventional stage will consume a considerable amount of time accelerating and decelerating. Such a stage also takes up considerable space. For example, a 10 microsecond dwell time with a 100 micron beam width would require a stage velocity of 10 meters/second (m/s). At an acceleration of 1 g or 9.8 m/s$^2$, it would take 1.02 seconds and 5.1 meters of travel to accelerate/decelerate. Providing 10.2 meters of space for the stage to accelerate and decelerate is undesirable.

Optical Scanning

The scanning of image 100 over substrate surface 62 may be performed using a stationary substrate and a moving image, by moving the substrate and keeping the image stationary, or a moving both the substrate the image.

Figure 11:
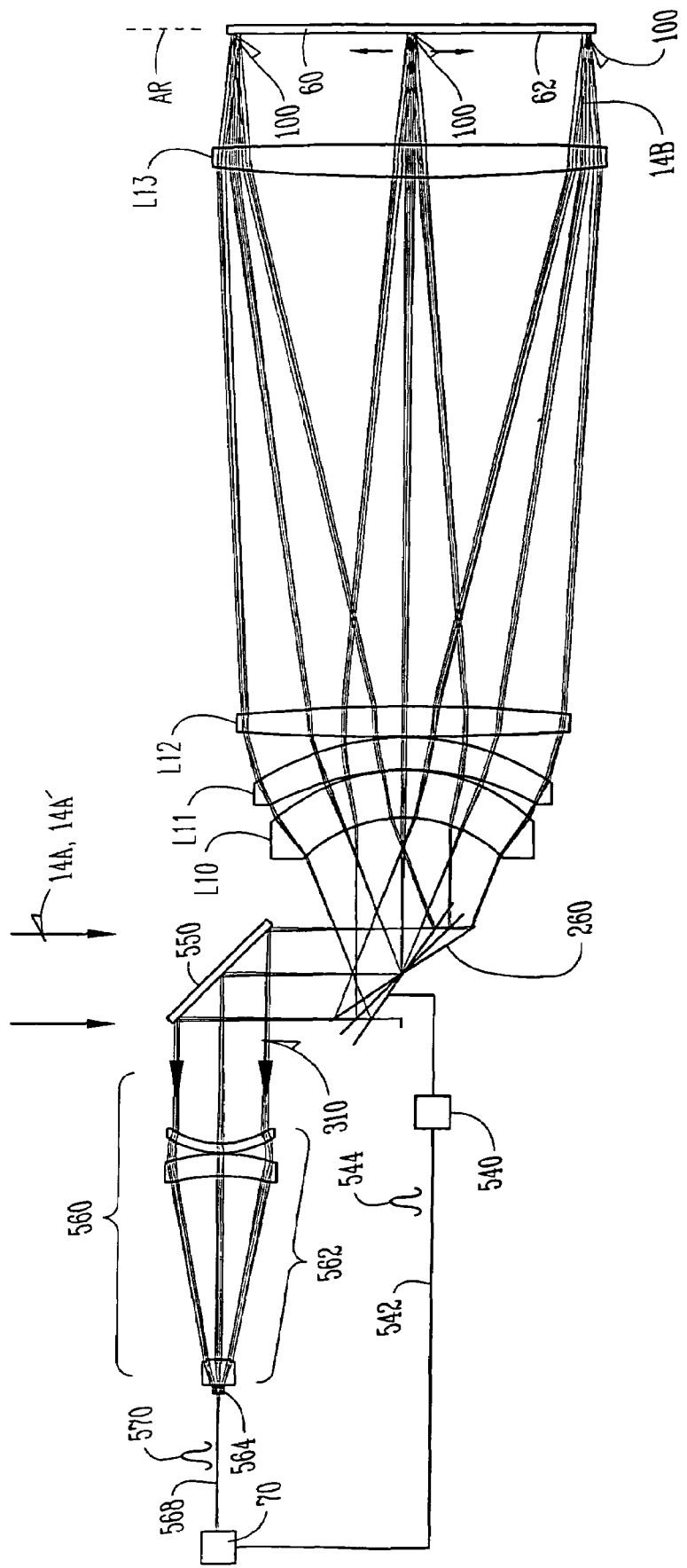
FIG. 11 is a cross-sectional view of an example embodiment of an optical system that includes a movable scanning mirror.

FIG. 11 is a cross-sectional view of an example embodiment of an optical system 20 that includes a movable scanning mirror 260. Very high effective acceleration/deceleration rates (i.e., rates at which a stage would need to move to achieve the same scanning effect) can be achieved using optical scanning.

In optical system 20 of FIG. 11, radiation beam 14A (or 14A') is reflected from scanning mirror 260 located at the pupil of an f-theta relay optical system 20 made from cylindrical elements L10 through L13. In an example embodiment, scanning mirror 260 is coupled to and driven by a servo-motor unit 540, which is coupled to controller 70 via line 542. Servo unit 540 is controlled by a signal 544 from controller 70 and carried on line 542.

Optical system 20 scans radiation beam 14B over substrate surface 62 to form a moving line image 100. Stage 46 increments the substrate position in the cross-scan direction after each scan to cover a desired region of the substrate.

In an example embodiment, lens elements L10 through L13 are made of ZnSe and are transparent to both the infrared wavelengths of radiation emitted by a $CO_2$ laser, and the near-IR and visible radiation emitted by the heated portion of the substrate. This permits a dichroic beamsplitter 550 to be placed in the path of radiation beam 14A upstream of scan mirror 260 to separate the visible and near IR wavelengths of radiation emitted from the substrate from the long wavelength radiation of radiation beam 14A used to heat the substrate.

Emitted radiation 310 is used to monitor and control the thermal processing of the substrate and is detected by a beam diagnostic system 560 having a collection lens 562 and a detector 564 coupled to controller 70 via line 568. In an example embodiment, emitted radiation 310 is filtered and focused onto separate detector arrays 564 (only one is shown). A signal 570 corresponding to the amount of radiation detected by detector 564 is provided to controller 70 via line 568.

Although FIG. 11 shows radiation beam 14B having an incident angle $\phi=0$, in other embodiments the incident angle is $\phi>0$. In an example embodiment, incident angle $\phi$ is changed by appropriately rotating substrate stage 46 about an axis AR.

An advantage of optical scanning is it can be performed at very high speeds so that a minimum amount of time is lost accelerating and decelerating the beam or the stage. With commercially available scanning optical systems, it is possible to achieve the equivalent of an 8000 g stage-acceleration.

Spiral Scanning

In another example embodiment, image 100 is scanned relative to substrate 60 in a spiral pattern. FIG. 12 is a plan view of four substrates 60 residing on stage 46, wherein the stage has the capability of moving both rotationally and linearly with respect to image 100 to create a spiral scanning pattern 604. The rotational motion is about a center of rotation 610. Also, stage 46 is capable of carrying multiple substrates, with four substrates being shown for the sake of illustration.

In an example embodiment, stage 46 includes a linear stage 612 and a rotational stage 614. Spiral scanning pattern 604 is formed via a combination of linear and rotational motion of the substrates so that each substrate is covered by part of the spiral scanning pattern. To keep the dwell time constant at each point on the substrates, the rotation rate is made inversely proportional to the distance of image 100 from center of rotation 610. Spiral scanning has the advantage that there is no rapid acceleration/deceleration except at the beginning and end of the processing. Accordingly, it is practical to obtain short dwell times with such an arrangement. Another advantage is that multiple substrates can be processed in a single scanning operation.

Alternate Raster Scanning

Scanning image 100 over substrate 60 in a boustrophedonic pattern with a small separation between adjacent path segments can result in overheating the substrate at the end of a scan segment where one segment has just been completed and a new one is starting right next to it. In such a case, the beginning portion of the new scan path segment contains a significant thermal gradient resulting from the just-completed scan path segment. This gradient raises the temperature produced by the new scan unless the beam intensity is appropriately modified. This makes it difficult to achieve a uniform maximum temperature across the entire substrate during scanning.

Figure 13A:
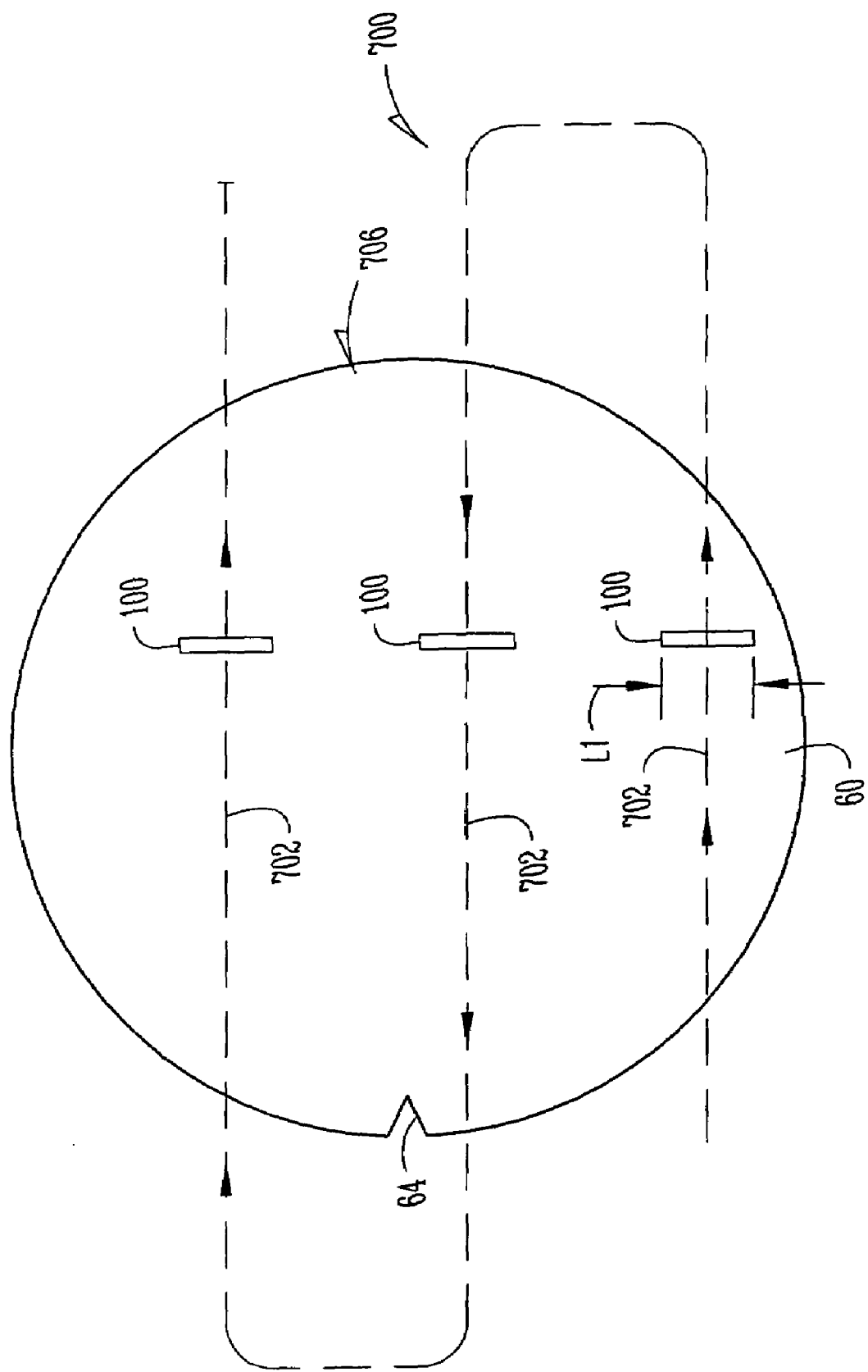

FIGS. 13A and 13B are plan views of a substrate 60 illustrating an alternate raster scanning path 700 having linear scanning path segments 702 and 704. With reference first to FIG. 13A, in the alternate raster scanning path 700, scanning path segments 702 are first carried out so that there is a gap 706 between adjacent scanning paths. In an example embodiment, gap 706 has a dimension equal to some integer multiple of the effective length of the line scan. In an example embodiment, the width of gap 706 is the same as or close to length L1 of image 100. Then, with reference to FIG. 13B, scanning path segments 704 are then carried out to fill in the gaps. This scanning method drastically reduces the thermal gradients in the scan path that arise with closely-spaced, consecutive scan path segments, making it easier to achieve a uniform maximum temperature across the substrate during scanning.

Throughput Comparison of Scanning Patterns

Figure 14:
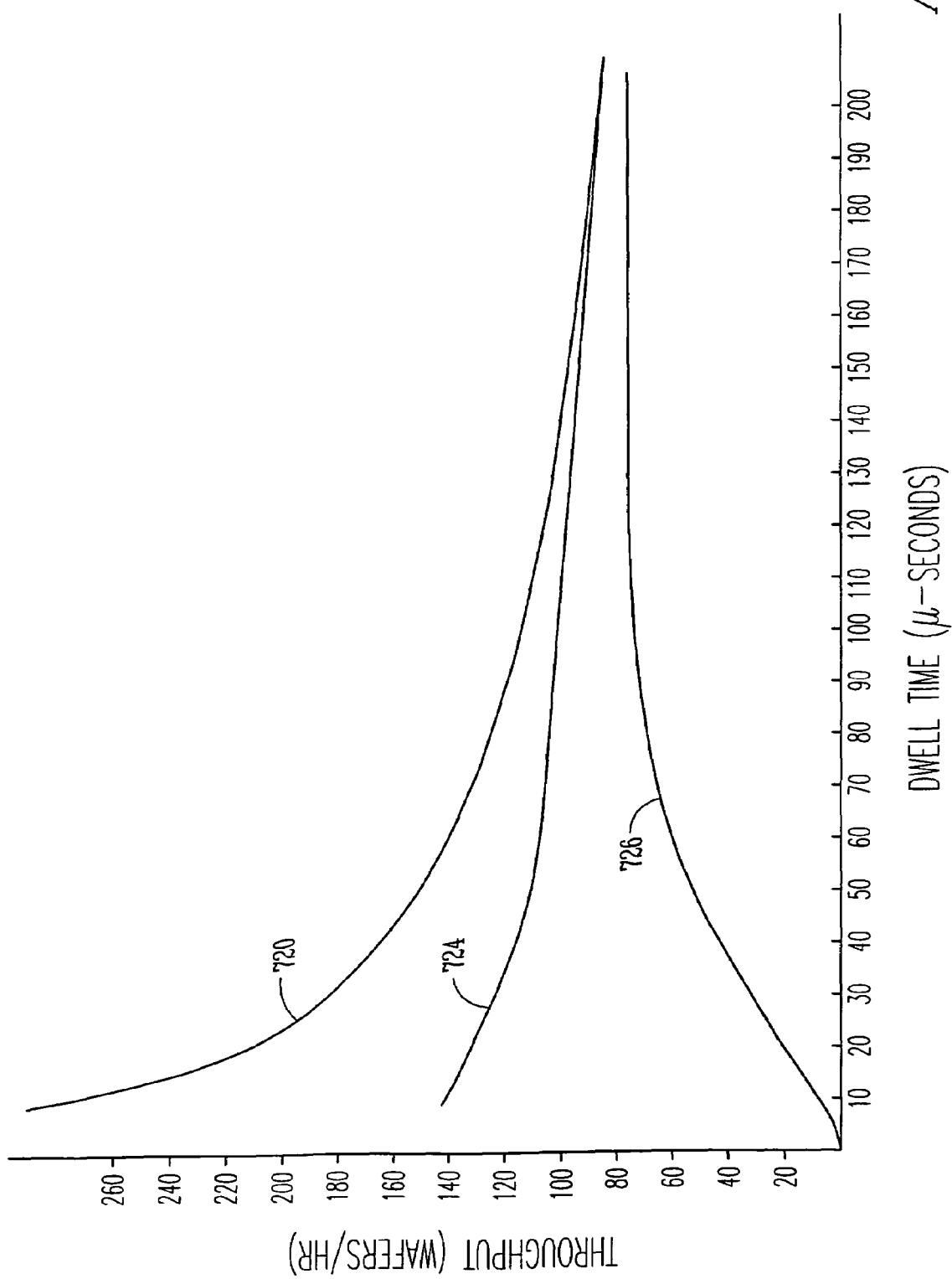
FIG. 14 is a plot of the simulated throughput in substrates/hour vs. the dwell time in microseconds for the spiral scanning method, the optical scanning method and the boustrophedonic scanning method for the apparatus of the present invention.

FIG. 14 is a plot of the simulated throughput (substrates/hour) vs. the dwell time (seconds) for the spiral scanning method (curve 720), the optical scanning method (curve 724) and the boustrophedonic (X-Y) scanning method (curve 726). The comparison assumes an example embodiment with a 5 kW laser as a continuous radiation source used to produce a Gaussian beam and thus a Gaussian image 100 with a beam width L2 of 100 microns scanned in overlapping scan paths to achieve a radiation uniformity of about ±2%.

From the plot, it is seen that the spiral scanning method has better throughput under all conditions. However, the spiral scanning method processes multiple substrates at one time and so requires a large surface capable of supporting 4 chucks. For example, for four 300 mm wafers, the surface would be larger than about 800 mm in diameter. Another disadvantage of this method is that it cannot maintain a constant direction between the line scan image and the crystal orientation of the substrate, so that it cannot maintain an optimum processing geometry for a crystalline substrate.

The optical scanning method has a throughput that is almost independent of dwell time and has an advantage over the X-Y stage scanning system for short dwell times requiring high scanning speeds.

Recycling Optical System

In the present invention, it is important to transfer as much energy as possible from continuous radiation source 12 to substrate 60. Accordingly, with reference briefly to FIG. 19, discussed in greater detail below, in an example embodiment, radiation beam 14B has a substantial range of incident angles at the substrate. That is to say, optical system 20 has a substantial numerical aperture NA=sin $\theta_{14B}$, wherein $\theta_{14B}$ is the half-angle formed by axis A1 and the outer rays 15A or 15B of radiation beam 14B. Note that incident angle $\phi_{14B}$ is measured between the surface normal N and axis A1, wherein axis A1 also represents an axial ray of radiation beam 14B. The angle $\phi_{14B}$ formed by axial ray (axis A1) and the substrate surface normal N is referred to herein as the "central angle" of the range of angles provided by radiation beam 14B.

In an example embodiment, the central angle $\phi_{14B}$ is selected to minimize the variation of reflectivity between the various film stacks (not shown) on the substrate.

In practice, it is difficult to prevent a portion of radiation beam 14B from reflecting from substrate surface 62. Thus, an example embodiment of the present invention involves capturing reflected radiation 23R and redirecting it back toward the substrate as "recycled radiation" 23RD, where it can be absorbed by the substrate at the location where incident beam 14B was reflected. The recycled radiation 23RD further contributes to the annealing process by providing additional heat to one or more substrate regions (e.g., regions 66A, 66B of FIG. 1A) to be processed.

Figure 15:
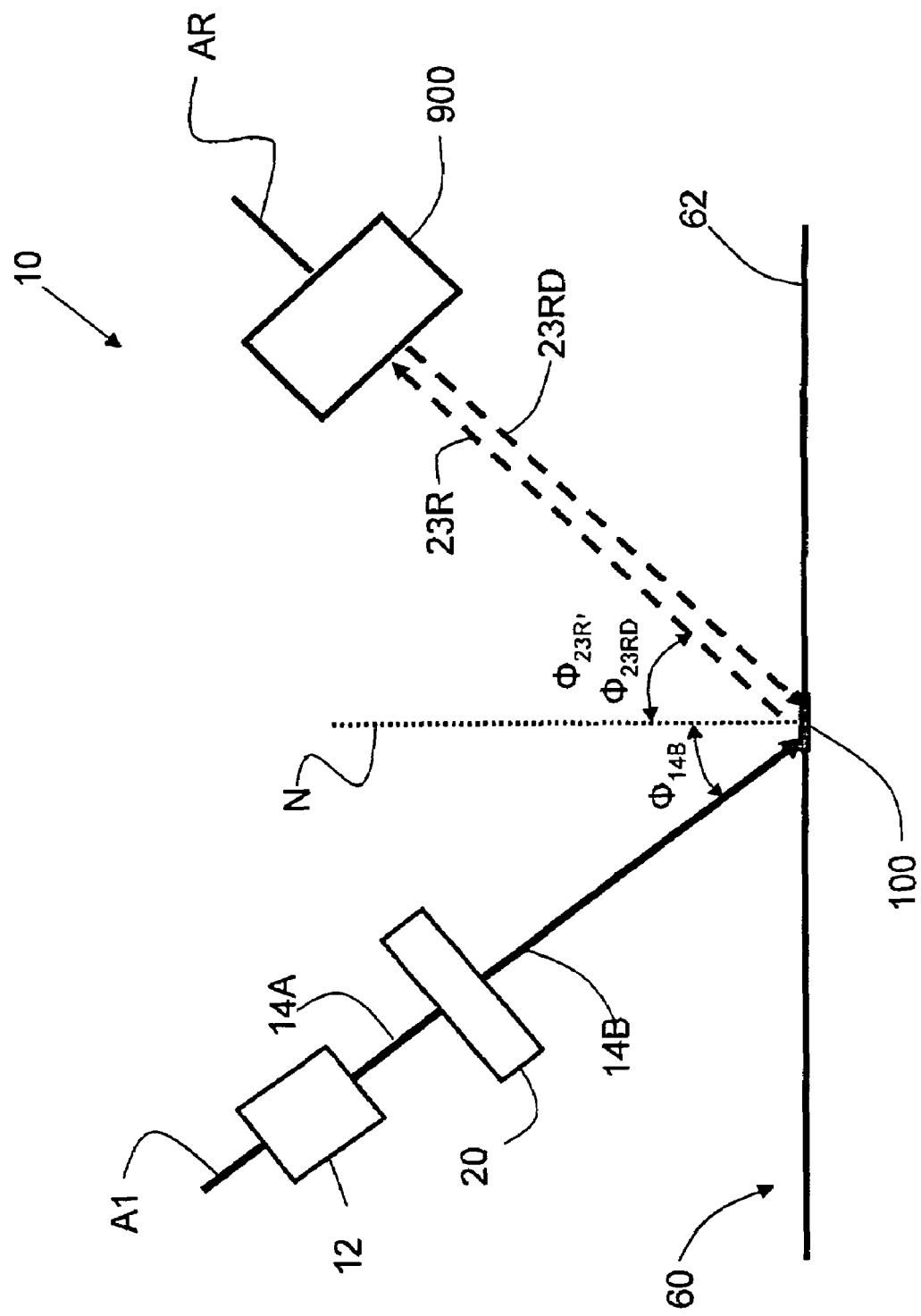
FIG. 15 is a close-up schematic diagram of an example embodiment of an LTP system similar to that of FIG. 1A, that further includes a recycling optical system arranged to receive reflected radiation and direct it back toward the substrate as "recycled radiation"

Accordingly, with reference now to FIG. 15, there is shown a close-up schematic diagram of an example embodiment of the laser scanning apparatus 10 of the present invention. Apparatus 10 of FIG. 15 is similar to that of FIG. 1A, however it further includes a recycling optical system 900 arranged to receive reflected radiation 23R and redirect it back to the substrate as recycled radiation 23RD. Recycling optical system 900 is arranged along an axis AR that makes an angle $\phi_{23RD}$ relative to surface normal N. In order for recycling system 900 to best receive reflected radiation 23R, in an example embodiment angle $\phi_{23RD}$ is made equal to radiation beam incident angle $\phi_{14B}$.

It should be noted that in the present invention, the substrate is irradiated with a pulse of radiation. As described above, the radiation "pulse" is created by scanning the substrate relative to radiation beam 14B so that select portions of the substrate are exposed to radiation beam 14B for a given amount of time, i.e., the dwell time of the beam. Strictly speaking, in the embodiment of apparatus 10 with recycling optical system 900, reflected radiation 23RD actually constitutes a second pulse of light weaker than the pulse associated with incident radiation 14B. This second pulse is time delayed from the first pulse an amount of time $\Delta T=OPL/c$, where OPL is the optical path length reflected light 23R travels in optical system 900 before returning to the substrate, and c is the speed of light ($\sim 3 \times 10^8$ m/s).

Since the OPL is on the order of a meter or less, the time delay $\Delta T$ between pulses is on the order of $10^{-9}$ second. As the scan speeds are on the order of 1 meter/second (m/s), the spatial separation of the first and second pulses at the substrate surface 62 is given by $\sim (1\ \text{m/s})(10^{-9}\ \text{s}) \sim 10^{-9}$ m, which is an insignificant spatial separation in the context of laser annealing. Thus, the incident and reflected radiation pulses effectively overlap, i.e., they reach the same portion of the substrate at the same time for all practical purposes. Thus, the combination of the incident and reflected pulses results in a single energy-enhanced radiation pulse. Stated differently, for all intents and purposes, the incident (first) radiation beam 14B and the recycled (second) radiation beam 23RD irradiate the substrate (e.g., one or more regions thereon) simultaneously.

Figure 16:
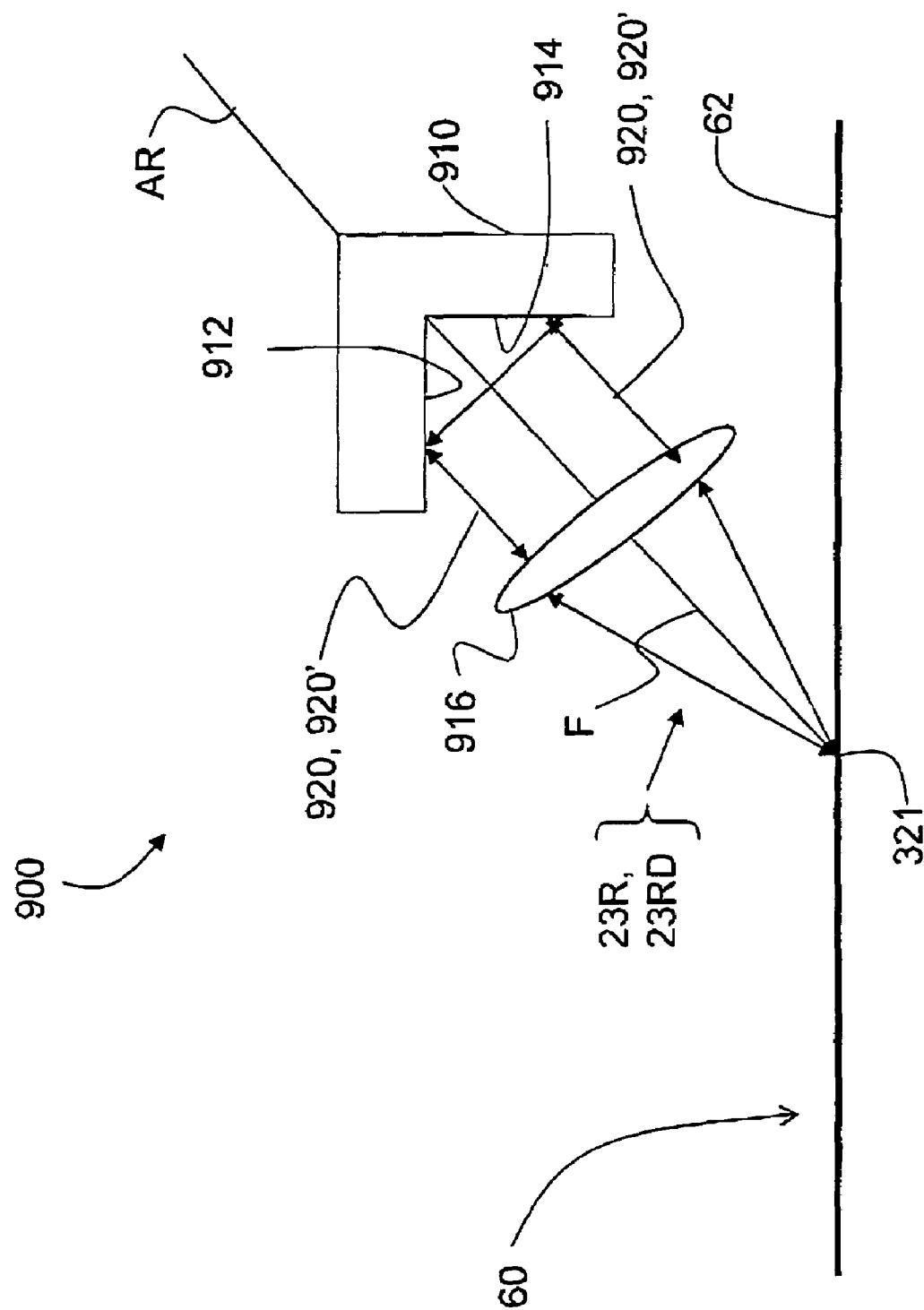
FIG. 16 is a cross-sectional diagram of an example embodiment of the recycling optical system of FIG. 15 that includes a corner reflector and a collecting/focusing lens.

FIG. 16 is a cross-sectional diagram of an example embodiment of recycling optical system 900 that includes a hollow corner cube reflector 910 and a collecting/focusing lens 916 having a focal length F that corresponds to the distance from the lens to substrate surface 62 along axis AR. Hollow corner cube reflector 910 has three reflecting surfaces that intersect at right angles, although to simplify the drawing only 2 surfaces, 912 and 914, are shown schematically in FIG. 16.

In the operation of optical system 900 of FIG. 16, lens 916 collects reflected radiation 23R from substrate surface 62 and directs it to corner cube reflector surfaces 912 and 914 as parallel rays 920. The parallel rays reflect from the three reflector surfaces and are directed back to lens 916 in exactly the opposite direction, on the opposite side of axis AR, as parallel rays 920' that now constitute recycled radiation 23RD. Parallel rays 920' are collected by lens 916 and are refocused at substrate surface 62 back at their point of origin 321.

Figure 17:
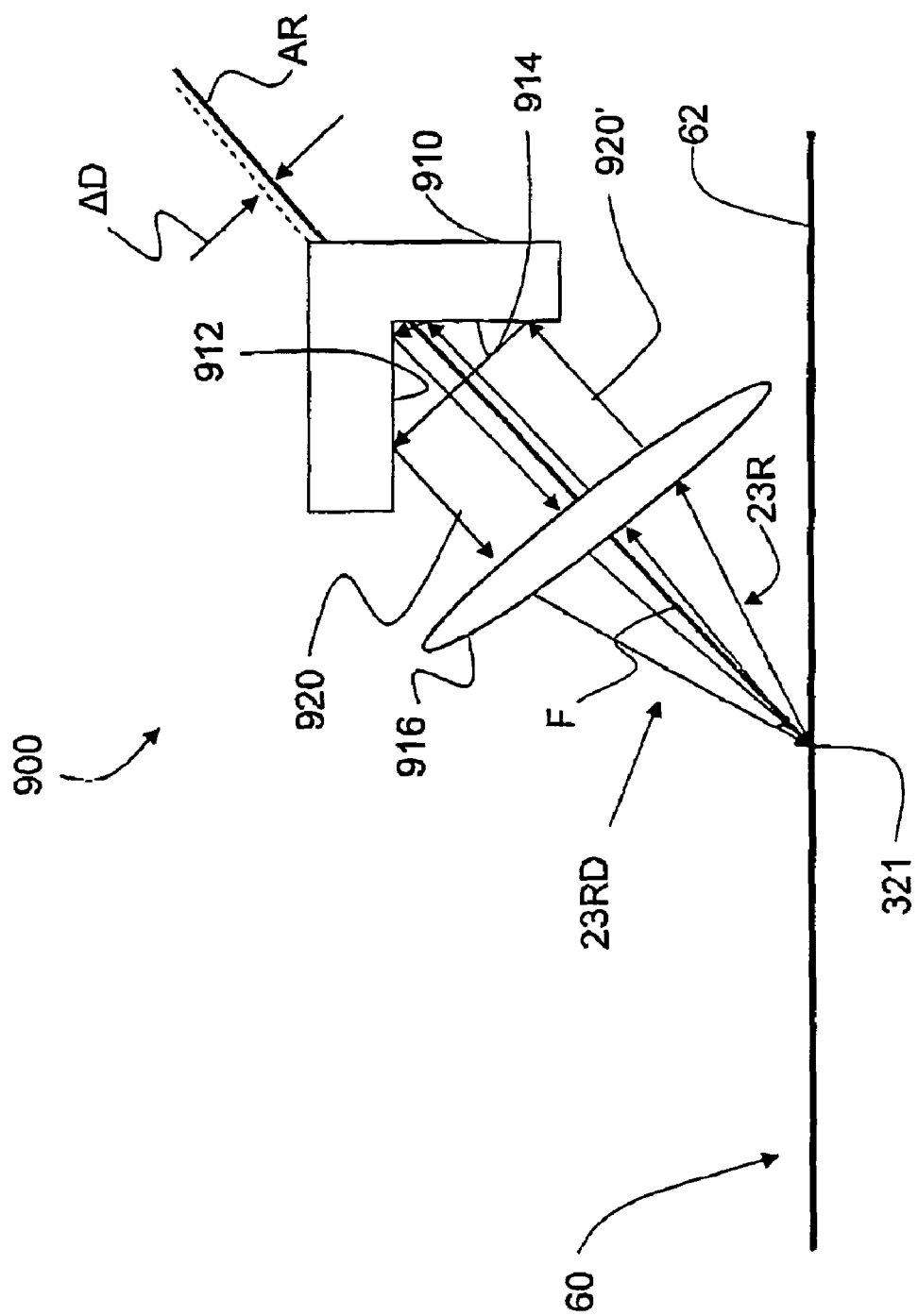
FIG. 17 is a cross-sectional diagram of a variation of the example embodiment of the recycling optical system of FIG. 16, wherein the corner reflector is displaced (decentered) relative to the axis (AR) by an amount ΔD, resulting in an offset in the angle of incidence between the directly incident and recycled radiation beams.

FIG. 17 is a cross-sectional diagram of a variation of the example embodiment illustrated in FIG. 16, wherein corner cube reflector 910 is displaced (decentered) relative to axis AR by an amount $\Delta D$. This results in an offset in the angle of incidence at the substrate between reflected radiation beam 23R and recycled radiation beam 23RD. Note that the position of the beam on the substrate remains the same—only the incidence angle changes. A relative offset between the incidence angles of the two beams can be exploited to prevent reflected radiation from traveling back up into continuous radiation source 12 (FIG. 15). In this particular example embodiment, a refractive corner cube that employs total internal reflection is not preferred because it does not preserve the polarization of the beam.

Figure 18:
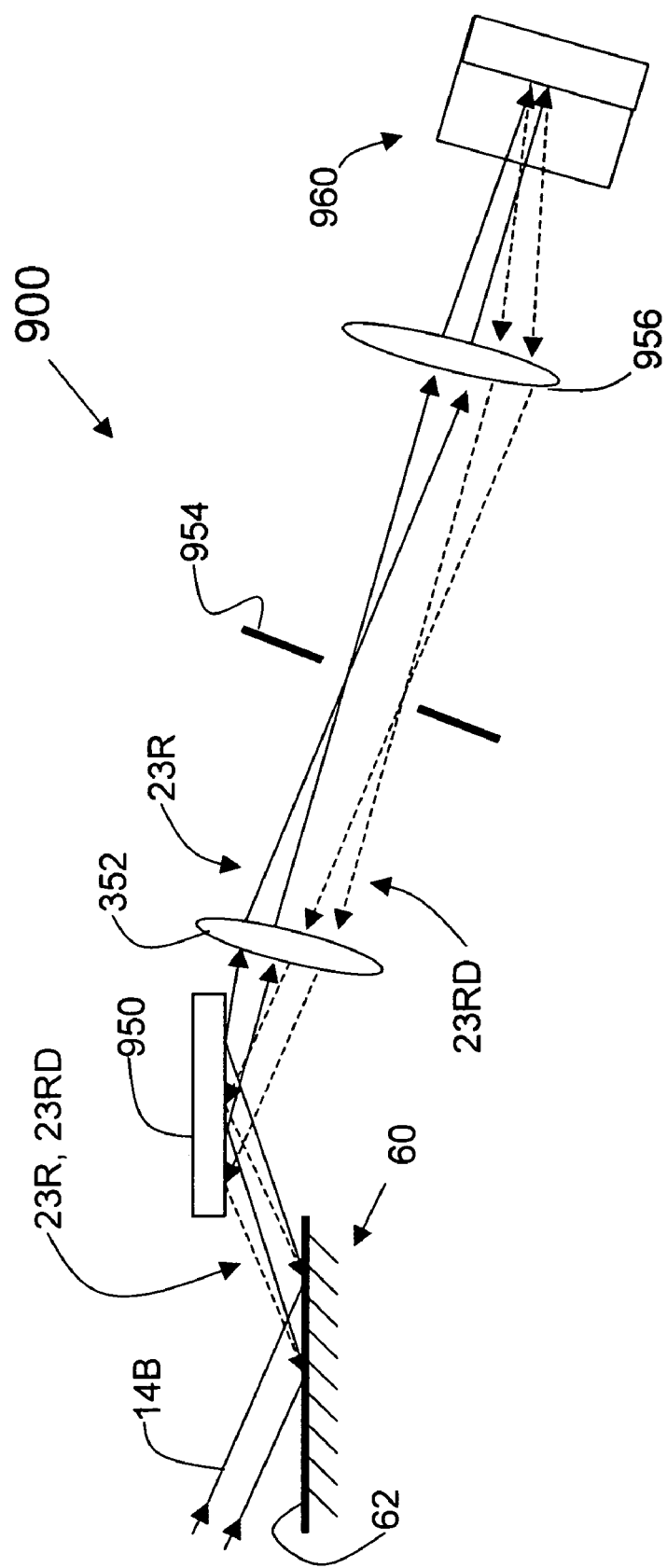
FIG. 18 is a cross-sectional schematic view of an example embodiment of the recycling optical system of FIG. 15 that includes a unit-magnification relay and a roof mirror.

FIG. 18 is a cross-sectional diagram of another example embodiment of recycling optical system 900. It includes, in order along axis AR from substrate 60, a cylindrical mirror 950, a first cylindrical lens 352, a pupil 954, a second cylindrical lens 956, and a tilted polarization-preserving roof mirror 960. In an example embodiment, first and second cylindrical lenses 352 and 956 have the same focal length (F') and are separated by twice their focal length (2F') and constitute a 1× relay with pupil 954 half-way in between. Roof mirror 960 is located F' away from cylindrical lens 956 and the roof-line is oriented with the direction of the p-polarized radiation it is reflecting.

In the example embodiment of recycling optical system 900 of FIG. 18, it is assumed that radiation beam 14B is focused by optical system 20 to form line image 100 on the substrate (FIG. 15). Cylindrical mirror 950 receives and collimates reflected radiation 23R, which then passes through cylindrical lenses 352 and 956. Roof mirror 960 is arranged to redirect the radiation back through the cylindrical lenses, to the cylindrical mirror, and back to the substrate surface. The tilt on roof mirror 960 with respect to incident radiation beam 23 determines the angle of incidence of the redirected preheating radiation beam 23RD onto substrate 60. In an example embodiment, polarization-preserving roof mirror 960 includes a small tilt designed to keep the recycled radiation 23RD from returning to continuous radiation source 12. Radiation returned to the resonating cavity of a laser or laser diode can cause operational problems, such as instabilities in the output power level of the laser.

Figure 19:
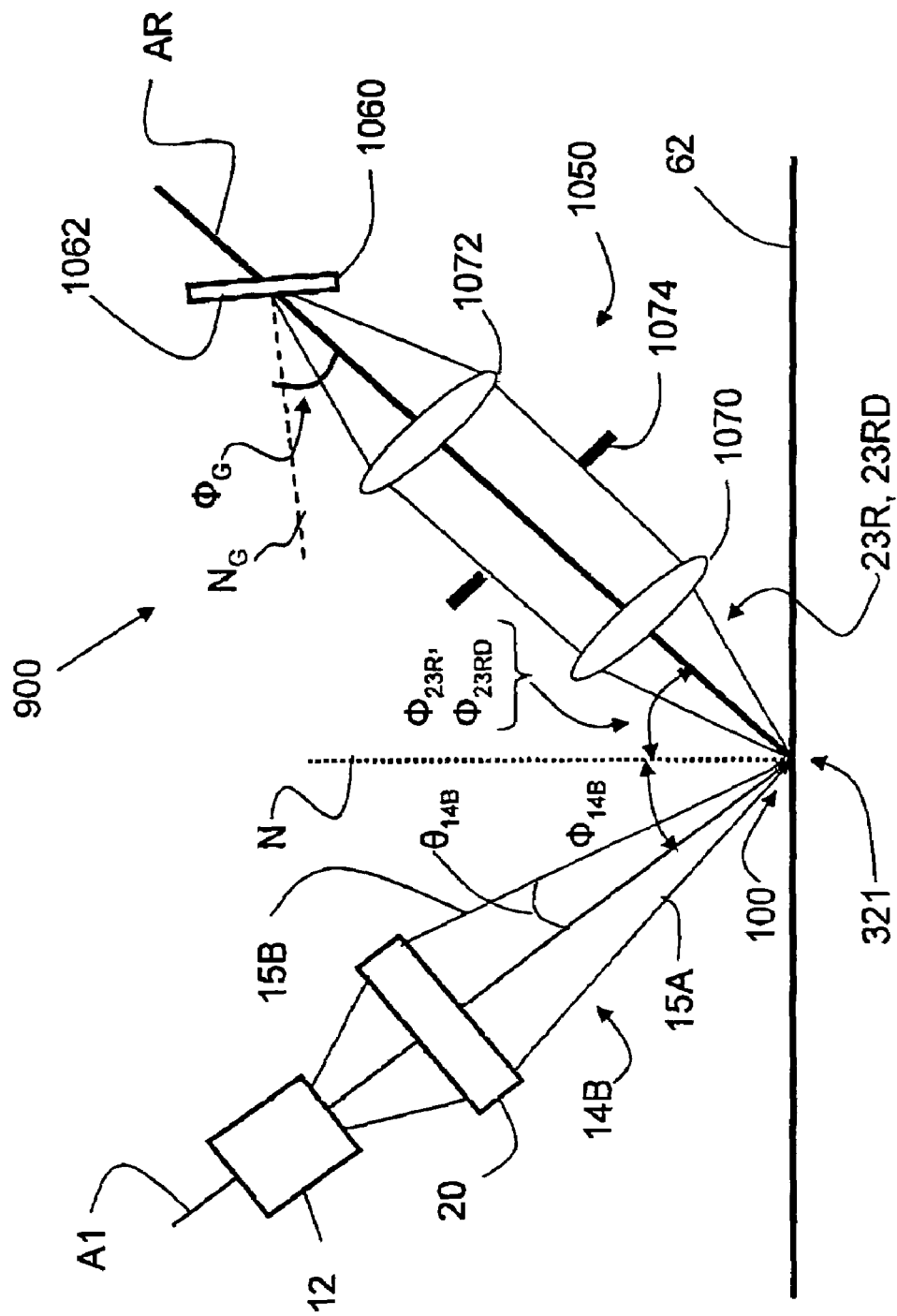
FIG. 19 is a cross-sectional diagram of another example embodiment of the recycling optical system of FIG. 15 that includes a collecting/focusing lens and a grating.

FIG. 19 is a cross-sectional diagram of another example embodiment of recycling optical system 900 that includes a collecting/focusing lens 1050 and a grating 1060 having a grating surface 1062. In an example embodiment, lens 1050 is a high-resolution, telecentric relay having first and second lenses 1070 and 1072 and an aperture stop 1074 located between the first and second lenses. Further in the example embodiment, lens 1050 has a focal length F1 at the substrate side and a focal length F2 at the grating side, and the lenses are arranged such that substrate surface 62 is located a distance F1 away from lens 1070 as measured along axis AR, and grating 1060 is located a distance F2 away from lens 1072 as measured along the axis AR. Also the two lenses, 1070 and 1072, are separated by a distance equal to the sum of their two focal lengths.

Grating surface 1062 is preferably adapted to optimally diffract the wavelength of radiation in reflected radiation beam 23R and is ruled so that the radiation incident on the grating surface is diffracted to return along the path of incidence. The optimum grating period P is given by $P = n\lambda / 2\sin\phi_G$ where $\lambda$ is the wavelength of the radiation and $\phi_G$ is the angle of incidence onto the grating relative to the grating surface normal $N_G$, and n is the refractive index of the medium surrounding the grating (n=1 for air). The purpose of the grating is to compensate for the tilted focal plane at the substrate, which would otherwise result in the return image being defocused by an amount depending on the distance in the plane of FIG. 19 between the point 321 and the axis of the relay 1050. Note that in this geometry, where relay 1050 operates at $-1\times$, $\phi_G = \phi_{14B} = \phi_{23R} = \phi_{23RD}$. In general, $\tan\phi_G = M \tan\phi_{23R}$ where M is the magnification of relay 1050 from the substrate to the grating.

In operation, reflected radiation 23R is collected by telecentric relay 1050, which includes lens 1070 and lens 1072, which brings the radiation to a focus onto grating surface 1062. Grating surface 1062 redirects (or more precisely, diffracts) the radiation back to relay 1050, which directs what is now recycled radiation 23RD back to substrate surface 62 at or near the point 321 where the reflected radiation originated.

A shortcoming with the embodiment of FIG. 19 is that reflected radiation 23R is imaged onto a very small spot on the grating on a continuing basis which can eventually melt or otherwise damage the grating. A similar problem would be encountered using a normal-incidence mirror (not shown) in place of the grating. Therefore, care must be taken in operating apparatus 10 using the example embodiment, of recycling optical system 900 of FIG. 19.

Figure 20:
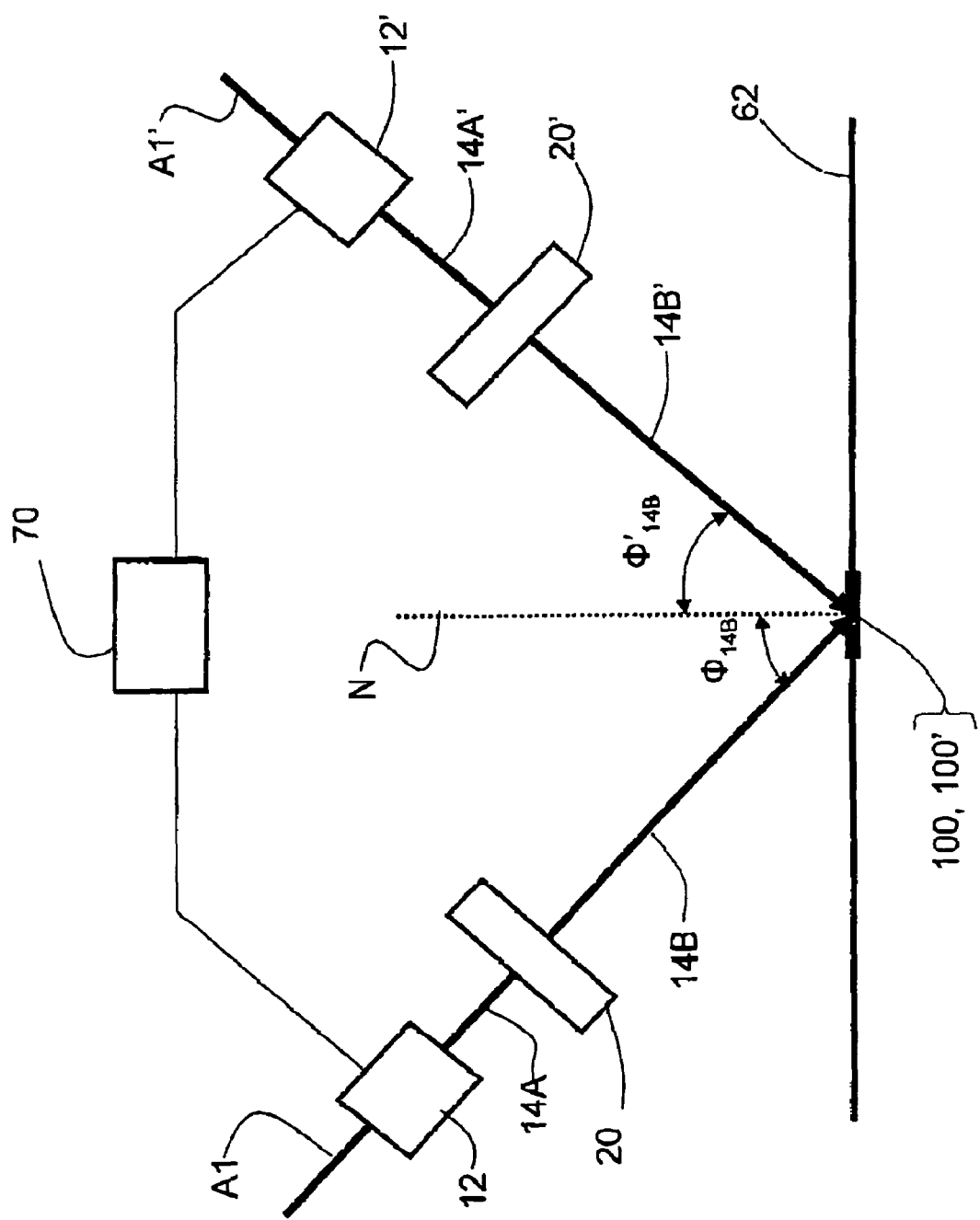
FIG. 20 is a cross-sectional schematic diagram of an example embodiment of an LTP system that employs two laser diode arrays and two corresponding LTP optical systems arranged to irradiate the substrate at similar incidence angles from opposite sides of the substrate normal.

FIG. 20 is a cross-sectional schematic view of an example embodiment of a laser scanning apparatus for annealing substrate 60, wherein the apparatus employs two optical systems 20 and 20' having associated two-dimensional laser diode array radiation sources 12 and 12', respectively, arranged along respective axes A1 and A1', respectively. Continuous radiation sources 12 and 12' are both operatively connected to controller 70 and emit radiation beams 14A and 14A', respectively. Each radiation beam is received by the corresponding optical system 20 and 20'. Optical systems 20 and 20' form from radiation beams 14A and 14A' corresponding radiation beams 14B and 14B' that in turn form respective images 100 and 100' at substrate surface 62.

In one example embodiment, optical systems 20 and 20' are adapted to form images 100 and 100' that at least partially overlap with one another at the substrate. In another example embodiment, images 100 and 100' are line images. In another example embodiment, at least one of annealing radiation beams 14B and 14B' is incident substrate surface 62 at an incident angle $\phi_{14B}$ or $\phi'_{14B}$ that is at or near the associated Brewster's angle $\phi_B$ for silicon.

Such an arrangement reduces the demands on the continuous radiation sources 12 and 12' to output high-power radiation beams 14B and 14B'. The example embodiment of the apparatus of FIG. 20 is not limited to two radiation beams 14 and 14B'. In general, any reasonable number of continuous radiation sources 12, 12', 12'', etc., and corresponding optical systems 20, 20', 20'', etc. can be used to form corresponding images 100, 100', 100'', etc., (e.g., line images) on substrate surface 62 to achieve the desired annealing effect.

The many features and advantages of the present invention are apparent from the detailed specification, and, thus, it is intended by the appended claims to cover all such features and advantages of the described apparatus that follow the true spirit and scope of the invention. Furthermore, since numerous modifications and changes will readily occur to those of skill in the art, it is not desired to limit the invention to the exact construction and operation described herein. Accordingly, other embodiments are within the scope of the appended claims.

What is claimed is:

1. An apparatus for thermally processing a region of a substrate, comprising:

a continuous radiation source capable of providing a continuous first radiation beam having a wavelength capable of heating the substrate region;

an optical system adapted to receive the first radiation beam and form a second radiation beam therefrom that forms an image at the substrate;

a recycling optical system arranged to receive radiation reflected from the substrate and direct the reflected radiation back to the substrate as a recycled radiation beam that approaches the substrate region at a non-normal incident angle selected according to the substrate region to form a reflected image having the same orientation as the image; and a stage adapted to support the substrate and scan the substrate relative to the image to heat the region with a first pulse of radiation from the optical system and a second pulse of radiation from the recycling optical system to a temperature sufficient to thermally process the region.

2. The system of claim 1, wherein the recycling optical system includes a collecting/focusing lens and a corner cube reflector.

3. The system of claim 2, wherein the recycled radiation beam and the second radiation beam have respective incident angles, the recycling optical system has an optical axis, and wherein the corner cube reflector is displaced relative to the optical axis so as to at least partially separate the incidence angles of the recycled and second radiation beams.

4. The system of claim 1, wherein the recycling optical system includes a telecentric relay and a diffraction grating.

5. The system of claim 1, wherein the recycling optical system includes in order from the substrate along an optical axis:
   a cylindrical mirror;
   a unit-magnification (1×) relay; and
   a polarization-preserving roof mirror adapted to reflect the reflected radiation back through the unit-magnification relay back to the substrate.

6. The system of claim 5, wherein the unit-magnification relay includes:
   first and second cylindrical lenses having the same focal length and separated by their twice the focal length; and
   a pupil half-way between the first and second cylindrical lenses.

7. The system of claim 1, wherein the recycling optical system is adapted to direct the recycled radiation beam to the substrate at an incident angle at or near the Brewster's angle.

8. An apparatus for thermally processing a region of a substrate, comprising:

two or more continuous radiation sources each capable of providing a continuous first radiation beam having a wavelength capable of heating the substrate region;

respective two or more optical systems each adapted to receive a corresponding one of the first radiation beams and form a second radiation beam therefrom that forms an image at the substrate, thereby forming respective two or more images at the substrate; and a stage adapted to support the substrate and scan the substrate relative to the two or more images to heat the region with respective two or more pulses of radiation to a temperature sufficient to thermally process the region, wherein the apparatus is constructed such that each second radiation beam approaches the substrate region at a non-normal incident angle selected according to the substrate region with each of said respective two or more images having the same orientation.

9. The apparatus of claim 8, wherein the two or more optical systems are adapted for form said respective two or more images as line images.

10. The apparatus of claim 1 wherein the recycled radiation beam is formed from parallel rays.

* * * * *